(12) United States Patent
Lenz

(10) Patent No.: US 8,282,698 B2
(45) Date of Patent: Oct. 9, 2012

(54) REDUCTION OF PARTICLE CONTAMINATION PRODUCED BY MOVING MECHANISMS IN A PROCESS TOOL

(75) Inventor: Eric H. Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 276 days.

(21) Appl. No.: 12/730,880

(22) Filed: Mar. 24, 2010

(65) Prior Publication Data

US 2011/0236159 A1  Sep. 29, 2011

(51) Int. Cl.
*B01D 46/00* (2006.01)

(52) U.S. Cl. .................. 55/385.2; 454/187; 414/935

(58) Field of Classification Search .............. 55/385.2, 55/385.6, 356, 471, 473, DIG. 18, DIG. 29, 55/DIG. 46; 454/184, 187, 180, 49, 57, 56, 454/192; 355/27, 30, 53; 414/935, 936, 414/937, 938, 939, 940, 941
See application file for complete search history.

(56) References Cited

U.S. PATENT DOCUMENTS

| | | | |
|---|---|---|---|
| 4,851,018 A * | 7/1989 | Lazzari et al. ................. 55/356 |
| 4,890,780 A | 1/1990 | Mimata et al. | |
| 5,096,364 A | 3/1992 | Messer et al. | |
| 5,207,548 A | 5/1993 | Suffel | |
| 5,229,615 A | 7/1993 | Brune et al. | |
| 5,295,777 A | 3/1994 | Hodos | |
| 5,425,793 A * | 6/1995 | Mori et al. ................... 55/385.2 |
| 5,451,130 A | 9/1995 | Kempf | |
| 5,525,106 A * | 6/1996 | Iizuka et al. ................. 454/187 |
| 5,679,405 A | 10/1997 | Thomas et al. | |
| 5,765,444 A | 6/1998 | Bacchi et al. | |
| 5,843,233 A | 12/1998 | van de Ven et al. | |
| 5,951,770 A | 9/1999 | Perlov et al. | |
| 5,979,475 A | 11/1999 | Satoh et al. | |
| 6,048,162 A | 4/2000 | Moslehi | |

(Continued)

FOREIGN PATENT DOCUMENTS

JP  237742 A  2/1990

(Continued)

OTHER PUBLICATIONS

"International Application Serial No. PCT/US2009/001900, International Search Report and Written Opinion mailed Nov. 24, 2009", 14 pgs.

(Continued)

*Primary Examiner* — Duane Smith
*Assistant Examiner* — Minh-Chau Pham
(74) *Attorney, Agent, or Firm* — Schwegman Lundberg & Woessner, P.A.

(57) ABSTRACT

In various exemplary embodiments described herein, a system and related method to reduce particle contamination on substrates is disclosed. The system includes a substrate traverser mechanism having tracks to transport substrate carriers with one or more traverser ducts arranged to surround, at least partially, the tracks. The one or more ducts have slits along at least a substantial portion of a length of the tracks. A traverser exhaust fan is coupled to one end of each of the one or more traverser ducts. The fan provides sufficient volumetric airflow such that a velocity of the volumetric airflow through the slits is greater than a terminal settling velocity of a predetermined particle size. The fan draws particles less than approximately the predetermined particle size generated by the substrate traverser mechanism into the one or more traverser ducts.

35 Claims, 16 Drawing Sheets

U.S. PATENT DOCUMENTS

| | | | |
|---|---|---|---|
| 6,050,891 A * | 4/2000 | Nering | 454/187 |
| 6,082,950 A | 7/2000 | Altwood et al. | |
| 6,097,469 A * | 8/2000 | Yaegashi et al. | 355/30 |
| 6,155,768 A | 12/2000 | Bacchi et al. | |
| 6,158,951 A | 12/2000 | Carr et al. | |
| 6,328,872 B1 | 12/2001 | Talieh et al. | |
| 6,368,183 B1 | 4/2002 | Trojan et al. | |
| 6,409,453 B1 | 6/2002 | Brodine et al. | |
| 6,429,139 B1 | 8/2002 | Ryan et al. | |
| 6,485,250 B2 | 11/2002 | Hofmeister | |
| 6,561,798 B2 | 5/2003 | Kuznetsov et al. | |
| 6,882,416 B1 | 4/2005 | Hunter et al. | |
| 7,014,672 B2 * | 3/2006 | Ishihara et al. | 55/356 |
| 7,255,633 B2 | 8/2007 | Muldowney | |
| 7,276,097 B2 * | 10/2007 | Edo | 55/385.2 |
| 7,527,664 B2 * | 5/2009 | Jackson | 55/385.2 |
| 2002/0075478 A1 | 6/2002 | Nulman et al. | |
| 2003/0202865 A1 | 10/2003 | Ponnekanti et al. | |
| 2004/0076505 A1 | 4/2004 | Kinnard et al. | |
| 2004/0144316 A1 | 7/2004 | Lee et al. | |
| 2007/0034479 A1 | 2/2007 | Todaka | |
| 2007/0224820 A1 | 9/2007 | Lim et al. | |
| 2007/0295274 A1 | 12/2007 | Webb et al. | |
| 2008/0031710 A1 | 2/2008 | Moriya et al. | |
| 2009/0022571 A1 | 1/2009 | Krupyshev et al. | |
| 2009/0081005 A1 | 3/2009 | Miyasaka | |
| 2009/0245984 A1 | 10/2009 | Lenz | |
| 2011/0200415 A1 | 8/2011 | Lenz | |
| 2011/0232771 A1 | 9/2011 | Lenz | |

FOREIGN PATENT DOCUMENTS

| | | | |
|---|---|---|---|
| JP | 3212951 A | 9/1991 | |
| JP | 200313223 A | 1/2003 | |
| JP | 2003068819 A | 3/2003 | |
| JP | 2003229466 A | 8/2003 | |
| JP | 2004193418 A | 7/2004 | |
| JP | 2004200329 A | 7/2004 | |
| JP | 200628577 A | 2/2006 | |
| KR | 1020020062562 A | 7/2002 | |
| KR | 1020070107361 A | 11/2007 | |
| WO | WO-0033359 A2 | 6/2000 | |
| WO | WO-2008140728 A2 | 11/2008 | |
| WO | WO-2009120360 A2 | 10/2009 | |
| WO | WO-2009120360 A3 | 1/2010 | |
| WO | WO-2011022870 A2 | 8/2011 | |
| WO | WO-2011102952 A3 | 8/2011 | |
| WO | WO-2011119729 A2 | 9/2011 | |
| WO | WO-2011119729 A3 | 9/2011 | |
| WO | WO-2011119733 A2 | 9/2011 | |
| WO | WO-2011119733 A3 | 9/2011 | |

OTHER PUBLICATIONS

"International Application Serial No. PCT/US2011/029623, International Search Report mailed Nov. 28, 2011", 3 pgs.

"International Application Serial No. PCT/US2011/029628, International Search Report mailed Nov. 30, 2011", 3 pgs.

"International Application Serial No. PCT/US2011/029628, Written Opinion mailed Nov. 30, 2011", 3 pgs.

"International Application Serial No. PCT/US2011/029623, Written Opinion mailed Nov. 28, 2011", 3 pgs.

"U.S. Appl. No. 12/145,707, Final Office Action mailed Aug. 26, 2011", 13 pgs.

"U.S. Appl. No. 12/145,707, Non Final Office Action mailed Mar. 16, 2011", 11 pgs.

"U.S. Appl. No. 12/145,707, Response filed Feb. 1, 2011 to Restriction Requirement mailed Jan. 25, 2011", 9 pgs.

"U.S. Appl. No. 12/145,707, Response filed Jun. 16, 2011 to Non Final Office Action mailed Mar. 16, 2011", 13 pgs.

"U.S. Appl. No. 12/145,707, Restriction Requirement mailed Jan. 25, 2011", 7 pgs.

"International Application Serial No. PCT/US2009/001900, International Written Opinion mailed Nov. 24, 2009", 6 pgs.

"International Application Serial No. PCT/US2009/01900, International Preliminary Report on Patentability mailed Oct. 7, 2010", 8 pgs.

"International Application Serial No. PCT/US2011/022870, International Search Report mailed Oct. 31, 2011", 3 pgs.

"International Application Serial No. PCT/US2011/022870, Written Opinion mailed Oct. 31, 2011", 3 pgs.

* cited by examiner

REDUCTION OF PARTICLE CONTAMINATION PRODUCED BY MOVING MECHANISMS IN A PROCESS TOOL

TECHNICAL FIELD

The present application relates generally to the field of semiconductor processing and, in a specific exemplary embodiment, to a system and method of controlling particulate count within a processing chamber.

BACKGROUND

In the manufacture of semiconductor devices, process chambers are frequently interfaced to permit transfer of wafers or substrates, for example, between the interfaced chambers. The transfer is typically performed via transfer modules that move the wafers, for example, through slots or ports that are provided in adjacent walls of the interfaced chambers. Transfer modules are generally used in conjunction with a variety of wafer processing modules (PMs), which may include semiconductor etching systems, material deposition systems, and flat panel display etching systems.

Semiconductor device geometries (i.e., integrated circuit design rules) have decreased dramatically in size since such devices were first introduced several decades ago. Integrated circuits (ICs) formed in the process chambers have generally followed "Moore's Law," meaning that the number of devices that fit onto a single integrated circuit chip doubles every two years. Contemporary IC fabrication facilities ("fabs") routinely produce 65 nm (0.065 μm) feature size devices and smaller. Future fabs will soon be producing devices having even smaller feature sizes. Commensurate with the reduced feature sizes are reduced contamination and particle budgets as even a single 30 nm particle can be a killer defect for a given IC.

Perhaps more importantly, from a yield and cost basis standpoint, the types of equipment (e.g., process tools) used in the fabrication process is becoming a primary technology driver. The fabrication process must be effective, but it must also be fast and not add to the total particle or contamination budget.

Contemporary throughput demands for current generations of 300 mm wafers in many applications are 360 wafers per hour or higher. Currently, systems use only a single carrier linear wafer motion requiring a non-productive time period while the wafer carrier is returned to a starting point in a process tool. Thus, wafer handling is slow. Proposed solutions to increase throughput have focused on joining a plurality of process tools in parallel. While such solutions may increase wafer throughput, they do so at the expense of tool footprint, increased equipment costs, reduced reliability, and, in many cases, increased particle generation from wafer transport mechanisms within the tools. Accordingly, improvements are needed in the field of semiconductor processing with a special emphasis on equipment reliability, throughput, and efficiency.

BRIEF DESCRIPTION OF DRAWINGS

Various ones of the appended drawings merely illustrate exemplary embodiments of the present invention and cannot be considered as limiting its scope.

DETAILED DESCRIPTION

Figure 1A:
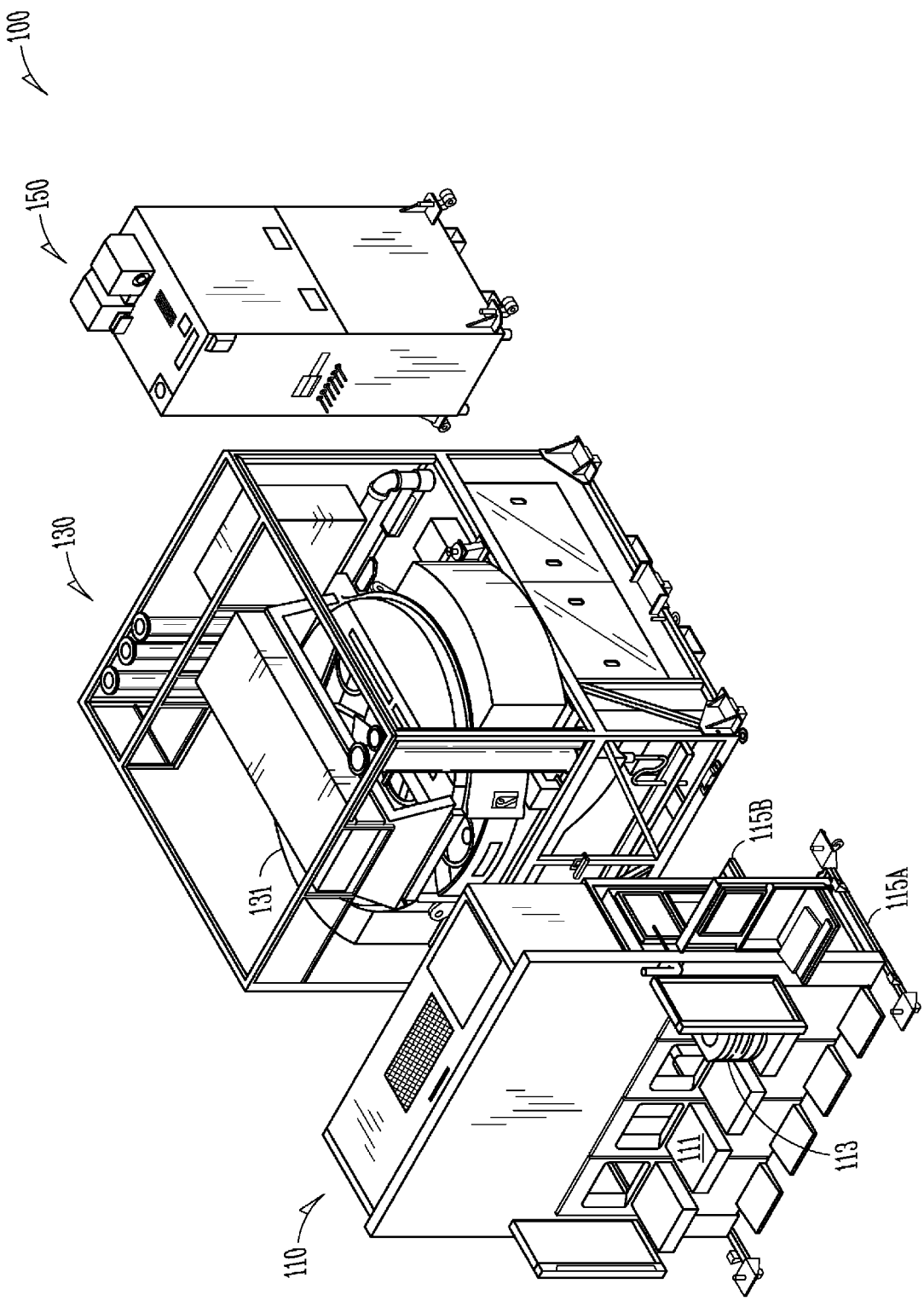
FIG. 1A is an exploded perspective view of an exemplary substrate processing tool, including an equipment front-end module (EFEM), a process module, and an electronics enclosure, incorporating at least aspects of the inventive subject matter described herein.

The description that follows includes illustrative systems, methods, and techniques that embody various aspects of the inventive subject matter discussed herein. In the following description, for purposes of explanation, numerous specific details are set forth to provide an understanding of various embodiments of the inventive subject matter. It will be evident, however, to those skilled in the art that embodiments of the inventive subject matter may be practiced without these specific details. Further, well-known operations, structures, and techniques have not been shown in detail.

As used herein, the term "or" may be construed in either an inclusive or an exclusive sense. Similarly, the term "exemplary" is construed merely to mean an example of something or an exemplar and not necessarily a preferred or ideal means of accomplishing a goal. Additionally, although various exemplary embodiments discussed below focus on substrate transport mechanisms and related contamination-related reduction techniques, the embodiments are given merely for clarity in disclosure. Thus, any type of substrate transport mechanism can employ various embodiments of the system described herein and is considered as being within a scope of the present inventive subject matter.

Moreover, as used herein, the term "substrate" is simply chosen as a convenient term referring to any of various substrate types used in the semiconductor and allied industries. Substrate types may therefore include silicon wafers, compound wafers, thin film head assemblies, polyethyleneterephthalate (PET) films, photomask blanks and reticles, or numerous other types of substrates known in the art.

In various exemplary embodiments described in detail herein, a method and system to provide filtered air is disclosed that reduces particulate contamination from contact with substrates being transported or processed in a process tool such as, for example, a wafer-cleaning tool used in the semiconductor industry. The method and system further maintain chemical and vapor containment in a substrate pass-through design while allowing for demand variations of the chemical area of a process chamber within the tool. A filtering unit provides air from above the substrates. The filtering unit can be moved for maintenance and has a gap above the substrate transport and processing area making the unit easy to move while reducing vibration transfer. In an exemplary embodiment, air enters the chemical section of the process chamber through a slot designed to provide a pressure difference between the chemical section and a substrate transfer section. Substrates exit the chemical zone through slots that minimize airflow from a lower region of the chamber. The dominant airflow into the chemical region is through an upper slot that reduces particles from being swept up from lower surfaces of the chamber. Where the substrate transport mechanism passes through to the chemical area of the chamber, the substrates pass through two slits in which a pressure differential is maintained thus pulling particles away from the chemical area while keeping chemical vapors from the non-chemical area. Various ones of the exemplary embodiments described herein thus allow for air velocities on surfaces of the substrates to be low while the substrates go through the slits separating the various regions within the chamber. Various ones of the exemplary embodiments further reduce or prevent chemical vapors from leaving chemical regions, and provide for sweeping of air from high particle regions reaching the substrates.

In another exemplary embodiment, airflow created by a designed pressure differential reduces or prevents particles from migrating from multiple linear substrate transporters having exposed linear belts. As described herein, multiple substrate carriers driven by linear belt drive slides tend to be particle generators due to friction and moving mechanical parts. Particles generated from the slides or belts are ideally prevented from getting on the substrates. Using governing equations for particle terminal velocities, airflow requirements were determined across a horizontal slot that substrates traverse to connect them to the linear slides. A required airflow velocity was determined for particles sizes less than a predetermined particle size. The predetermined particle size may be less than, for example, about 50 µm, such that the airflow velocity flows faster than a terminal velocity of the particle size ranges of interest. In this example, particles larger than 50 µm would fall at high enough rates that they could not traverse the horizontal slot. Baffling was designed to make the slot flow uniform even with the draw for the slit being at one end.

Thus, in an exemplary embodiment, a system to reduce particle contamination on substrates is disclosed. The system includes a substrate traverser mechanism having tracks to transport substrate carriers with one or more traverser ducts arranged to surround, at least partially, the tracks. The one or more ducts have slits along at least a substantial portion of a length of the tracks. A traverser exhaust fan is coupled to one end of each of the one or more traverser ducts. The fan provides sufficient volumetric airflow such that a velocity of the volumetric airflow through the slits is greater than a terminal settling velocity of a predetermined particle size. The fan draws particles less than approximately the predetermined particle size generated by the substrate traverser mechanism into the one or more traverser ducts.

In another exemplary embodiment, a system to reduce particle contamination on substrates is disclosed. The system includes a housing to couple a substrate production tool to a fan filter unit to provide filtered air to the housing, a facility connection to couple the substrate production tool to a reduced pressure exhaust mechanism, and a substrate transfer section coupled between the housing the facility connection. The substrate transfer section partially contains a clock-arm substrate carrier mechanism having a plurality of carrier arms each having a midpoint between opposing ends and arranged to rotate about the midpoint in planes parallel to one another. The substrate transfer section further includes a linear substrate traverser mechanism with a number of linear substrate carriers mounted to the traverser mechanism. Each of the linear substrate carriers is arranged to transport substrates in a plane substantially parallel to the planes of the carrier arms. Additionally, each of the linear substrate carriers is in a different plane from one another. A substrate process area is coupled to the substrate transfer section by one or more substrate transfer slots with the clock-arm substrate carrier mechanism being arranged to transport the substrates between the substrate process area and the substrate transfer section via the one or more substrate transfer slots. A chamber substantially contains the substrate transfer section and the substrate process area with the chamber being coupled to the housing to receive the filtered air and coupled to the facility connection to provide an exhaust for excess gas flow. The chamber maintains a low pressure in the substrate process area relative to the substrate transfer section.

In another exemplary embodiment, a system to reduce particle contamination on wafers in a wafer process tool is disclosed. The system includes a fan filter unit to provide filtered air to the wafer process tool, a facility connection to couple the wafer process tool to a reduced pressure exhaust mechanism of a wafer fabrication facility, and a wafer transfer section between the fan filter unit and the facility connection. The wafer transfer section partially contains a clock-arm wafer carrier mechanism having a plurality of carrier arms each having a midpoint between opposing ends and arranged to rotate about the midpoint in planes parallel to one another. The wafer transfer section also has a linear wafer traverser mechanism with a number of linear wafer carriers. Each of the linear wafer carriers can transport wafers in a plane substantially parallel to the planes of the wafer arms with each of the plurality of linear wafer carriers being in a different plane from one another. A wafer process area is coupled to the wafer transfer section by one or more wafer transfer slots with the clock-arm wafer carrier mechanism arranged to transport the wafers between the wafer process area and the wafer transfer section via the one or more wafer transfer slots. A process chamber substantially contains the wafer transfer section and the wafer process area. The process chamber is coupled to the fan filter unit to receive the filtered air and to the facility connection to provide an exhaust for excess gas flow. The process chamber maintains a low pressure in the wafer process area relative to the wafer transfer section.

In another exemplary embodiment, a method of reducing particle contamination on substrates is disclosed. The method includes providing a housing to couple a substrate production tool to a fan filter unit to provide filtered air to the substrate production tool, providing a facility connection to couple the substrate production tool to a reduced pressure exhaust mechanism to provide an exhaust for excess gas flow within the substrate production tool, and providing a substrate transfer section coupled between the housing and the facility connection. The substrate transfer section partially contains a clock-arm substrate carrier mechanism having a number of carrier arms each having a midpoint between opposing ends and arranged to rotate about the midpoint in planes parallel to one another. The substrate transfer section also has a linear substrate traverser mechanism with a number of linear substrate carriers. Each of the linear substrate carriers can transport substrates in a plane substantially parallel to the planes of the carrier arms with each of the linear substrate carriers being in a different plane from one another. The exemplary method further includes maintaining a substrate process area of the substrate production tool at a lower pressure than a pressure of the substrate transfer section of the substrate production tool, maintaining the substrate process area at a higher pressure than a pressure of the reduced pressure exhaust mechanism, and maintaining the substrate transfer section at a higher pressure than the pressure of the reduced pressure exhaust mechanism.

With reference to FIG. 1A, an exploded perspective view of pieces of equipment used to process substrates, such as semiconductor wafers, is shown. A processing tool 100 (commonly referred to as a process tool or other substrate production tool) is shown to include an equipment front-end module (EFEM) 110, a process module 130, and an electronics enclosure 150.

In operation, the EFEM 110, the process module 130, and the electronics enclosure 150 are unified as a single unit. The process module 130 includes a process chamber 131 (or other chamber types in which substrates are located, such as, for example, an in-situ metrology chamber). The process chamber may include a substrate transfer section and a substrate process area, both defined in detail, below, in which various processes are performed on a batch of substrates. The processes may include various types of, for example, substrate cleaning and wet-etch (e.g., chemical etch) steps known independently in the semiconductor and related art fields. Additionally, the process module 130 is generally enclosed to reduce any particulate, organic, or other contamination of substrates within the process module 130 and the process chamber 131. Further, the enclosure (not shown) minimizes a risk of hazardous interactions between an equipment operator and moving mechanisms within the process module 130, thereby increasing safety of the operator. Operating power is supplied to the EFEM 110 and the process module 130 by the electronics enclosure 150.

The EFEM 110 is shown to include a number of substrate load stations 111, a first operator control interface 115A, and a second operator control interface 115B. From one of these control interfaces, an operator may input and run, for example, process recipes for a particular batch of substrates. The EFEM 110 is also shown to include a front opening unified pod (FOUP) 113 placed on one of the substrate load stations 111. The FOUP 113 is a particular type of plastic enclosure designed to hold semiconductor wafers (e.g., generally silicon wafers (Si) but may also include various other wafer types formed from elemental semiconductor materials such as germanium (Ge), or compound semiconductor materials such as gallium-arsenide (GaAs) or indium arsenide (InAs)). The FOUP 113 holds the wafers (not shown) securely and safely in a controlled environment. Although not shown explicitly in FIG. 1A, a skilled artisan will recognize readily that a FOUP may simultaneously be present on each of the substrate load stations 111. One or more robots (not shown) may be associated with each FOUP.

Once the FOUP 113 is placed on one of the substrate load stations 111, the robot (not shown) within the EFEM 110 may directly access the wafers contained within the FOUP 113. The EFEM 110 thus allows an operator to load and unload substrates from the FOUP 113 into the process chamber 131 via, for example, a two-bladed or four-blade robot (not shown but known independently in the art). Although not limited to a particular robot type, one robot that can be employed is, for example, a model FC06N, manufactured by Kawasaki (USA), Inc. of Wixom, Mich., USA. In a specific exemplary embodiment, the robot may incorporate a collapsive end-effector having four 3.8 mm blades with an approximate 10 mm spacing between adjacent blades. The 10 mm spacing is matched to the wafer-to-wafer spacing in a typical FOUP. Details of various transport processes occurring within the process chamber 131 are described in more detail with reference to FIGS. 4A, 4B, and 5, below.

Figure 1B:
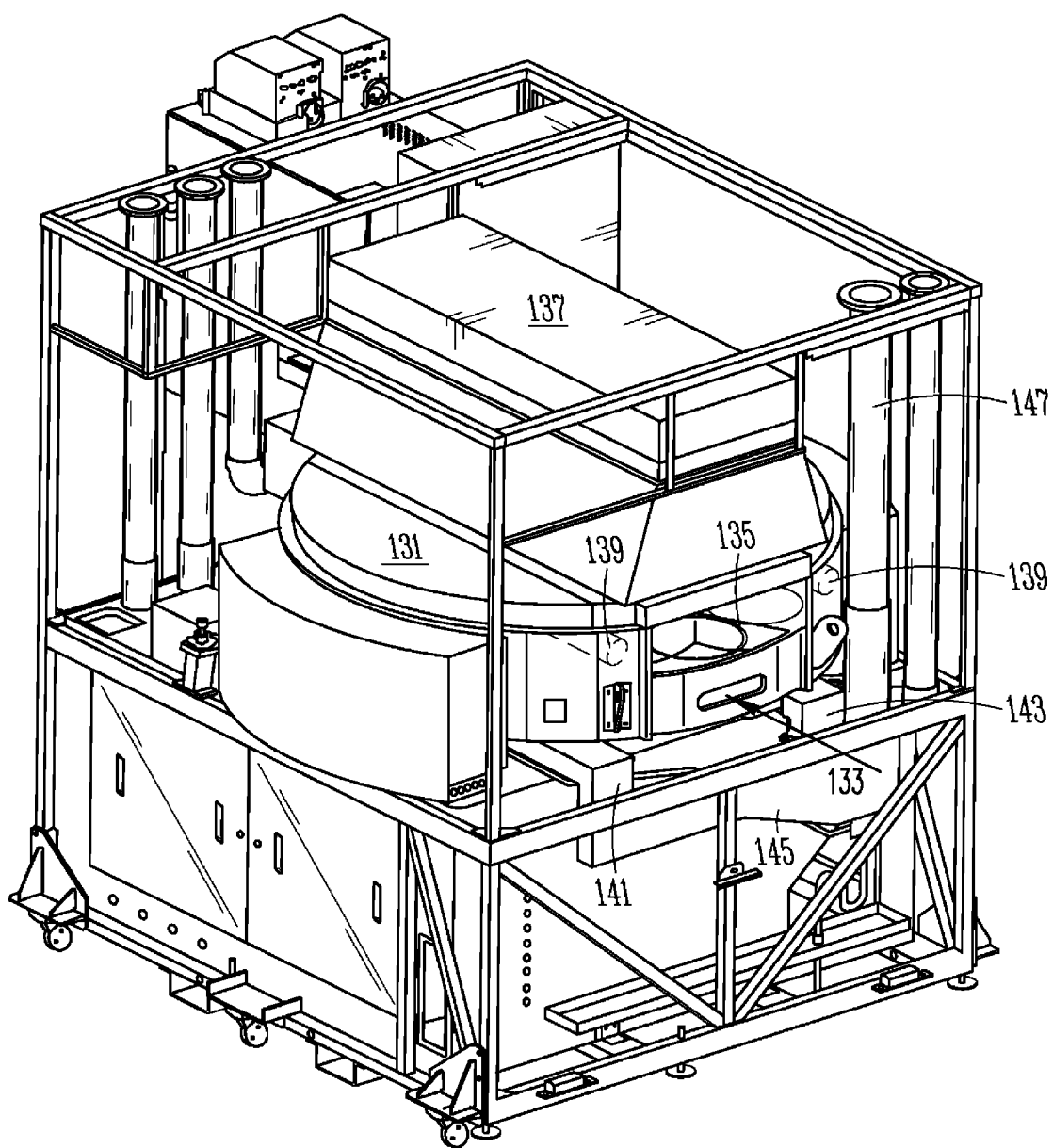
FIG. 1B is a perspective view of the process module of FIG. 1A including a process chamber.

Referring now to FIG. 1B and with concurrent reference to FIG. 1A, substrates (not shown) are transported by the robots from the FOUP 113 to one of a number of substrate carriers 135 (i.e., rotary-mounted substrate carriers) located on a clock-arm substrate carrier mechanism (not shown explicitly in either FIG. 1A or FIG. 1B but described in detail with reference to FIG. 2, below). The substrate is loaded or unloaded into or out of the process chamber 131 through a substrate transport slot 133.

A high-efficiency particulate air (HEPA) filter placed within a fan filter unit (FFU) 137 provides substantially clean air within the process chamber 131. The FFU 137 is located above the process chamber 131 to provide airflow and particular pressure gradients within the chamber to reduce particulate contamination on and around substrates. The airflow partially reduces particulate contamination by a producing a boundary layer above the substrate through which small particles are unable to pass. Both large and small particles are then swept out of the process chamber 131 and into an exhaust system, described below. Improved chemical containment is also achieved through use of the produced pressure gradients (described in more detail, below).

Although the FFU 137 is described as employing a HEPA filter herein, a skilled artisan will recognize that other filter types (e.g., an ultra-low particulate air (ULPA) filter) could readily be substituted for the HEPA filter with added fan capacity as needed to account for a higher pressure-drop across, for example, the ULPA filter. Calculation of the airflow and pressure gradients produced by the FFU 137 is discussed with reference to FIGS. 6-7H, below. The process chamber 131 is also shown to include ionizer bars 139 that run parallel to a long axis of the FFU 137. The ionizer bars 139 reduce electrostatic charges that would otherwise accumulate on substrates within the process chamber 131 caused by friction generated by the airflow across the substrates from the FFU 137. A substrate with a charge more readily attracts oppositely charged particles. As is known to a skilled artisan, the ability of an ionizer to reduce charge on any surface (e.g., the substrate) is time dependent. Therefore, the ionizer bars 139 can be located relative to the substrates (located beneath the ionizer bars) where a relatively long residence time (e.g., 1 second to 5 seconds but at least partially dependent on localized airflow) assists in producing an intended reduction in electrostatic charge on the substrates. The ionizer bars 139 can be located in other positions within the process chamber 131, may be unipolar (i.e., producing anions or cations) or bipolar (i.e., a balanced ion generator), may be of other sizes and shapes, and may be instantiated in numerous positions within the process chamber 131 above the substrates. In a specific exemplary embodiment, the ionizer bars 139 are approximately 64 inches (about 1.63 m) in length.

In a specific exemplary embodiment, the FFU 137 has a volumetric flow rate of approximately 910 cubic feet per minute (cfm, or about 25.8 m$^3$ per minute) with a face velocity from an outlet side of the HEPA filter being approximately 90 feet per minute (fpm, or about 27.4 m per minute). In other embodiments, the FFU 137 has a volumetric flow rate of approximately 1300 cubic feet per minute (about 36.8 m$^3$ per minute). The HEPA filter can be formed from a tetrafluoroethylene (TFE) material with a 99.99995% filter efficiency at 0.3 μm. A skilled artisan will recognize that the ULPA filter, described above, can have an even higher efficiency (as measured at 0.12 μm). The FFU 137 and the process chamber 131 are designed so that less than five particles at a size of 55 nm and lower are added due to substrate transport considerations.

With continued reference to FIG. 1B, a first chamber exhaust pipe 141 and a second chamber exhaust pipe 143 draw particulates and fluids (e.g., excess process gases, such as air produced by the FFU 137, and excess process liquids) from opposite sides of the process chamber 131 into a cross-tube assembly 145. In an exemplary embodiment, a chamber exhaust stack 147 provides makeup airflow allowing particulates and fluids entering the cross-tube assembly 145 to be readily drawn into an exhaust/drain system (not shown) within the fabrication facility. In other exemplary embodiments, the chamber exhaust stack 147 may optionally be coupled to an exhaust connection within the fabrication facility to provide an air draw. More detail on the exhaust system is given, below, with reference to FIGS. 5A and 5B.

Figure 2:
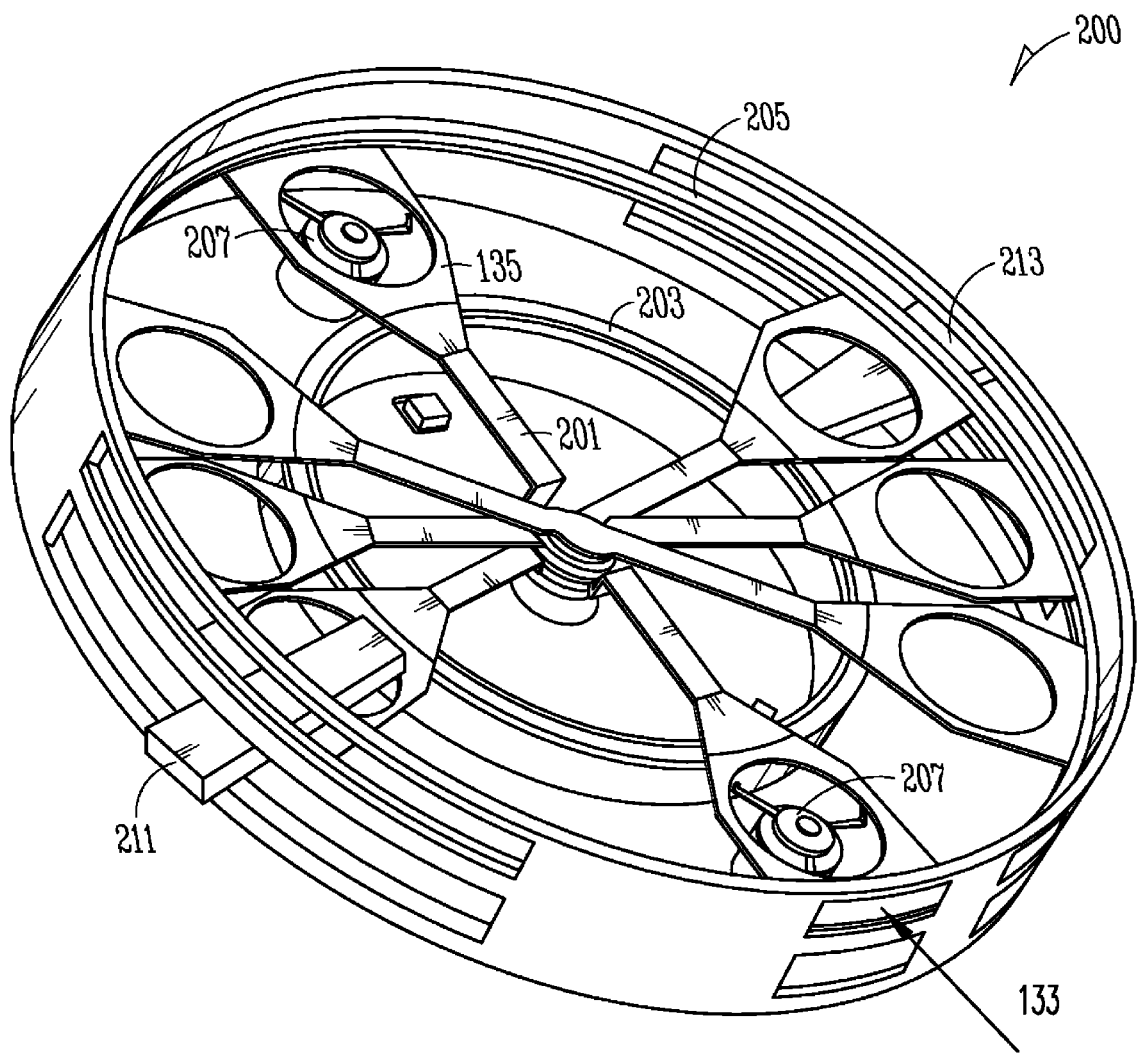
FIG. 2 is a perspective view of an exemplary clock-arm substrate carrier mechanism used within the process chamber of FIG. 1B.

FIG. 2 shows an exemplary embodiment of a clock-arm substrate carrier mechanism 200. The clock-arm substrate carrier mechanism 200 is shown to include a number of rotary arms 201, with each end of the rotary arms 201 having an associated one of the substrate carriers 135, an inner track section 203, an outer track section 205, and substrate lifters 207. Each of the rotary arms 201 may be driven independently and, thus, may be started, stopped, and accelerated independently of the remaining ones of the rotary arms 201. Additionally, although only four of the rotary arms 201 are shown, the clock-arm substrate carrier mechanism 200 can be adapted to handle any number of arms. The number of arms will be at least partially dependent upon a physical size of, for example, a diameter of the outer track section 205 and a physical size of each the substrate carriers 135. The rotary arms 201 and the substrate carriers 135 may be scaled as necessary to adapt to a given substrate size. For example, the substrate carriers 135 may be designed to accommodate 300 mm silicon wafers, 100 mm gallium arsenide (GaAs) wafers, or a next generation of 450 mm wafers.

In a specific exemplary embodiment, the outer track section 205 is physically arranged to accommodate a 30 inch (approximately 760 mm) radius from midpoints of the rotary arms 201 to a center of the substrate carriers 135. As discussed, above, the outer track section 205 can be sized appropriately depending upon the number of rotary arms employed and the size of the substrates handled.

The substrate lifters 207 may be of any general type commonly known and used in, for example, the semiconductor industry. As shown, two instantiations of the substrate lifters 207 are spaced approximately 180° apart from one another. In other embodiments (not shown), there may a higher number of substrate lifters 207 used.

Additionally, one or both of the substrate lifters 207 may be rotated 180° to correct for the 180° rotation of a substrate through the clock-arm substrate carrier mechanism 200. The rotation occurs would thus occur between when moving a substrate between the clock arm carrier and the linear carrier as discussed, below. When only one of the substrate lifters 207 is rotating 180°, the 180° rotation occurs on the moving of a substrate from the clock carrier into the linear carrier and on the moving a substrate from the linear carrier to the clock carrier.

In general operation, once a particular one of the substrate carriers 135 is positioned over one of the substrate lifters 207, an external robot (not shown) may place a wafer to or from a substrate carrier (e.g., a wafer boat or the FOUP 113) onto one of the substrate lifters 207. The selected one of the substrate lifters 207 then lowers the substrate onto to the particular one of the substrate carriers 135 and the lifter continues to lower itself far enough to avoid any collisions with any of the rotary arms 201 or any other moving mechanisms contained within the clock-arm substrate carrier mechanism 200.

With continued reference to FIG. 2, the clock-arm substrate carrier mechanism 200 further includes an upper chemical-release head 211 and a lower chemical-release head 213 situated so as to spray or otherwise apply chemicals (e.g., such as various combinations of the cleaning or etching chemicals) as a substrate passes in proximity to the upper chemical-release head 211 and a lower chemical-release head 213. Utilizing at least two heads allows chemicals to be applied to both sides of a wafer in a single pass without a need to invert the substrate. Alternatively, the upper chemical-release head 211 and a lower chemical-release head 213 may be arranged to apply chemicals to both sides of a substrate simultaneously. As will be recognizable to a skilled artisan, any number of chemical-release heads may be utilized.

In a specific exemplary embodiment, the upper chemical-release head 211 and a lower chemical-release head 213 are each designed in a "pie-section" shape, having a wider cross-sectional width at an outer periphery of the clock-arm substrate carrier mechanism 200 than at an inner periphery. The pie-section shape accommodates a higher angular velocity on the outermost portion of the substrate as compared with the inner portion. Thus, more chemicals may be delivered to an outer portion of the substrate through, for example, an increased number of spray nozzles directed at the substrate, thus insuring uniform chemical coverage over each face of the substrate.

As a result of various features described herein, the clock-arm substrate carrier mechanism 200 can provide for continuous flow manufacturing and lends itself to processing without significant temporal gaps between successive substrates. As noted above, wet chemical cleaning or etching can involve a number of various steps. Starting and stopping wet chemistry is hard to control, wasteful, and inefficient. The clock-arm substrate carrier mechanism 200 processes substrates in a continuous mode by having each of the substrate carriers 135 travel in a full 360° arc. Unlike various prior art systems that provide only linear systems requiring a 180° return in which no wafer cleaning or processing occurs, the clock-arm substrate carrier mechanism 200 may run parallel cleaning processes on opposing sides simultaneously. Consequently, chemical control can be shared, thereby reducing control system overhead and redundant circuitry. As such, chemical savings can be as much as 300% (i.e., a four-time reduction in chemical usage) from contemporary linear systems.

Within the process chamber 131 (see FIG. 1B), at least two parallel processes occur simultaneously: chemical control and substrate motion. As described in more detail with reference to FIG. 3, below, independent control of velocities and accelerations of the substrate carriers 135 allows for an exit step and for loading and unloading one or more substrates substantially simultaneously. The independent control of the substrate carriers 135 further allows a carrier to accelerate to catch up in a process flow once a carrier has been loaded or unloaded, also described in more detail, below.

Figure 3:
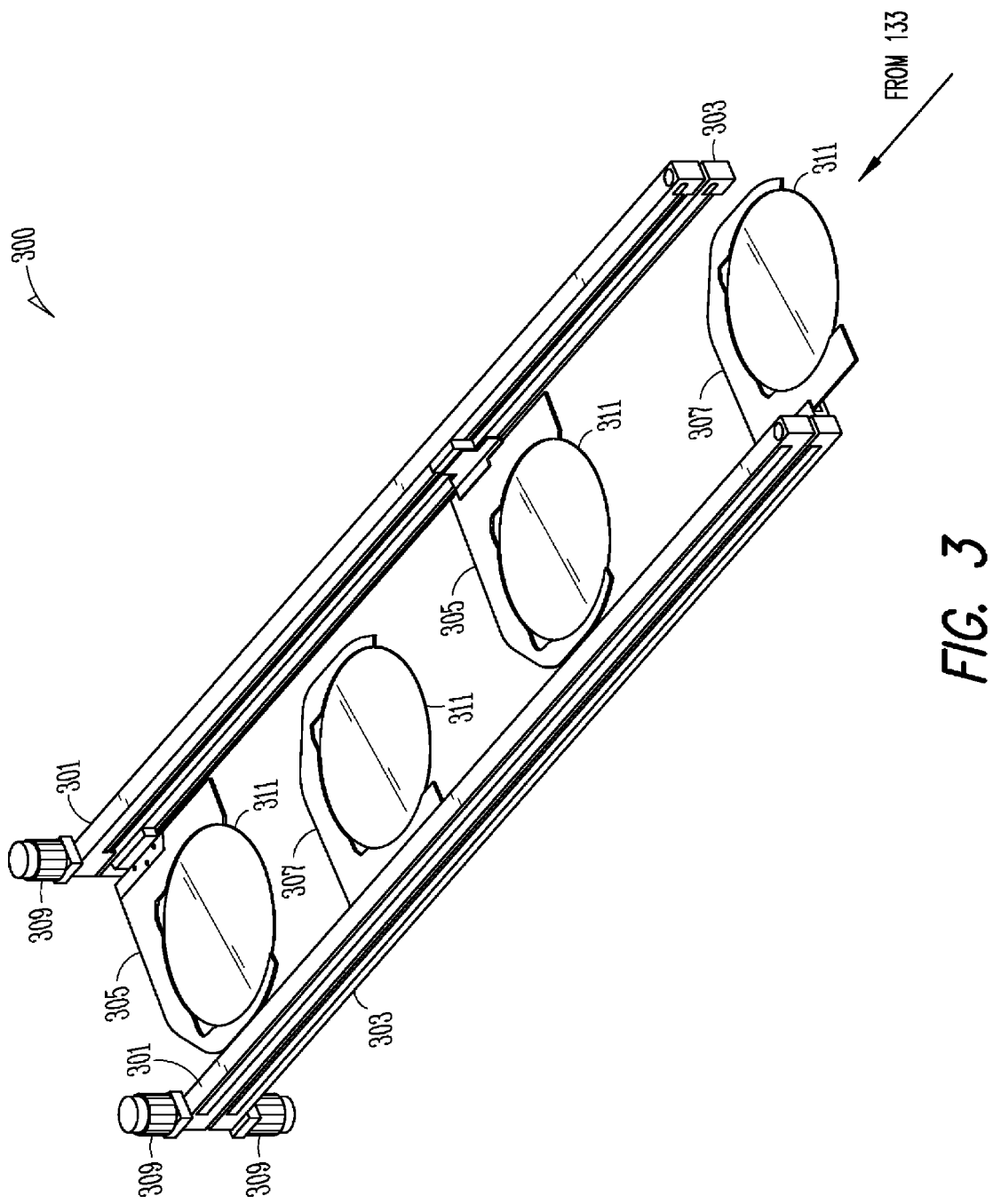
FIG. 3 is a perspective view of an exemplary substrate traverser mechanism to be used in conjunction with the clock-arm substrate carrier mechanism of FIG. 2 and within the process chamber of FIG. 1B.

With reference now to FIG. 3, an exemplary embodiment of a substrate traverser mechanism 300 is shown to include a pair of upper tracks 301, a pair of lower tracks 303, a pair of right-mounted substrate carriers 305, and a pair of left-mounted substrate carriers 307. The substrate carriers, as shown, are movable in different planes that are parallel to one another as well as being in planes parallel to the rotary arms 201 of the clock-arm substrate carrier mechanism 200. Each of the carriers is also shown as holding a semiconductor substrate 311 merely to assist in describing the overall movement and transport of substrates, below. An indication of where the substrate traverser mechanism 300 is located in reference to the substrate transport slot 133 is also shown in FIG. 3.

Each of the pair of right-mounted substrate carriers 305 and the pair of left-mounted substrate carriers 307 is driven in a linear manner independently by a motor 309. The motor can be selected from a number of motor types. For example, in a specific exemplary embodiment, each of the motors 309 may be a standard NEMA 23 frame dimensions such as an SM2315D servo motor with an integral encoder (available from Animatics Corporation, 3200 Patrick Henry Drive, Santa Clara, Calif., USA). Although not shown explicitly, the carriers are driven by the motor 309 associated with a given carrier by a linear actuator (e.g., a linear belt drive system). Such linear actuator systems are known independently in the art. For example, a Festo® EGC-50 belt driven linear actuator (manufactured by FESTO KG, Ruiter Strasse 82, Esslingen, Federal Republic of Germany) may be employed as a carrier drive mechanism for the substrate traverser mechanism 300.

As described herein in various exemplary embodiments, the substrate traverser mechanism 300 is shown to have only a particular number of tracks, substrate carriers, motors, and associated drive mechanisms. However, a skilled artisan will recognize that the concepts described herein may readily be extrapolated to any number or tracks and substrate carriers.

Figure 4A:
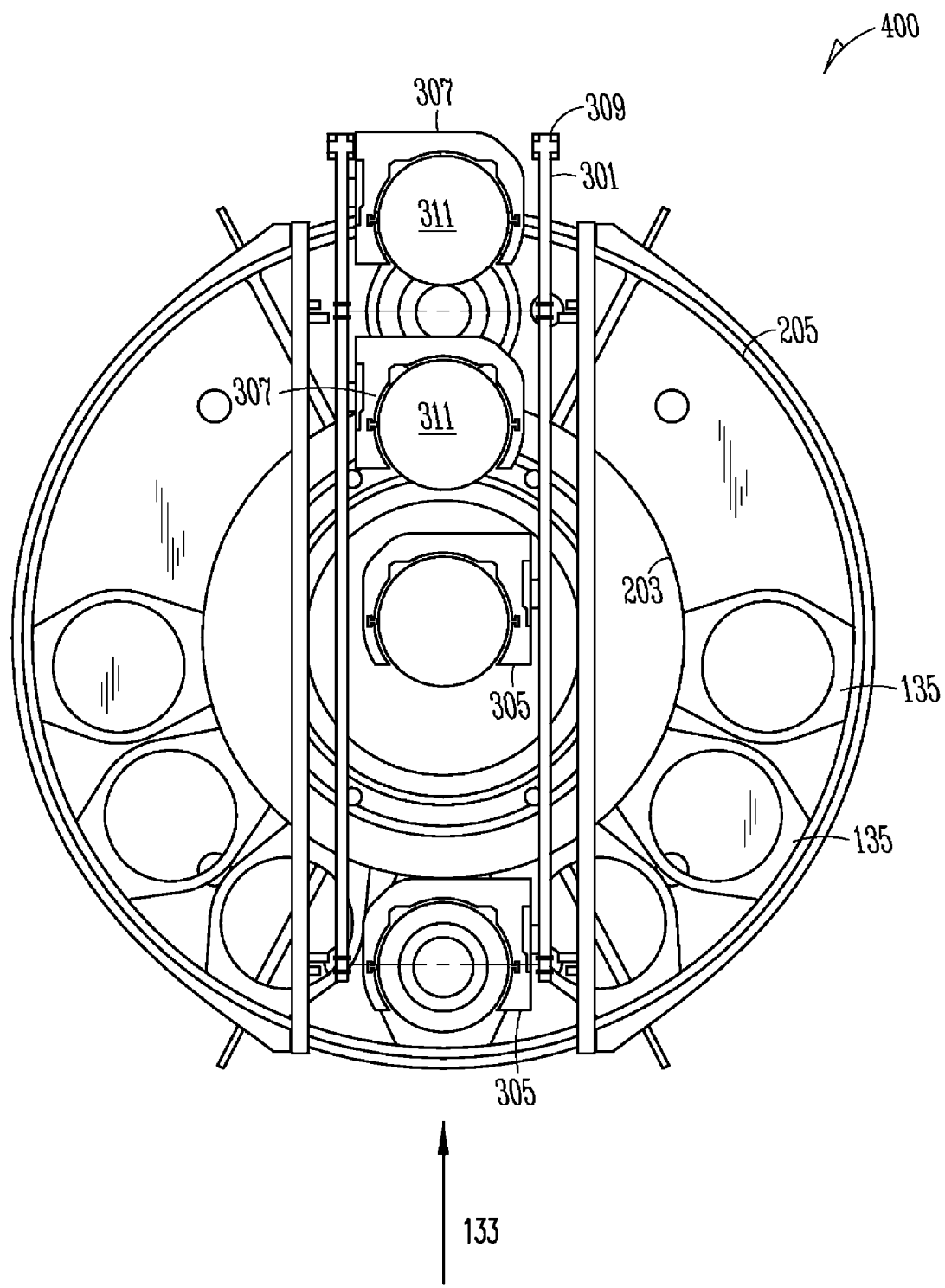
FIG. 4A is a plan view of the clock-arm substrate carrier mechanism of FIG. 2 used in conjunction with the substrate traverser mechanism of FIG. 3 in an exemplary embodiment.

Referring now to FIG. 4A, an exemplary embodiment shows a plan view 400 of the clock-arm substrate carrier mechanism 200 (see FIG. 2) in conjunction with the substrate traverser mechanism 300 (see FIG. 3). In this exemplary embodiment, the substrate traverser mechanism 300 operates above the clock-arm substrate carrier mechanism 200.

An exemplary operation of the combined clock-arm and traverser mechanism is now described with concurrent reference to FIGS. 2 and 4A. After a substrate has been processed in the process chamber 131 (see FIG. 1B), one of the rotary arms 201 is temporarily stopped above one of the substrate lifters 207 (e.g., the lifter located opposite the substrate transport slot 133). The substrate lifter 207 raises the semiconductor substrate 311 from the substrate carrier 135 located on the rotary arm 201. If not already in place, one of the substrate carriers on the substrate traverser mechanism 300, for example, one of the right-mounted substrate carriers 305, is traversed to a position behind (i.e., at or near an extreme position of the traverser end opposite the substrate transport slot 133) the substrate lifter 207. The substrate lifter 207 then raises the semiconductor substrate 311 high enough to clear an uppermost carrier surface of the right-mounted substrate carrier 305. The carrier then moves laterally to receive (i.e., to center the carrier under the substrate-laden lifter) the semiconductor substrate 311 and the substrate lifter 207 lowers, thus placing the substrate onto the right-mounted substrate carrier 305. The substrate lifter 207 continues to lower below a plane formed by a lowermost portion of the substrate carrier 135. At this point in time, the rotary arm 201, previously stopped, may be moved to another position. Once the semiconductor substrate 311 is mounted onto the right-mounted substrate carrier 305, the substrate may be linearly transported to the substrate transport slot 133 and transferred back into a slot in the FOUP 113 (see FIG. 1A) by the robot (not shown).

Substantially concurrent with the substrate removal process just described, an unprocessed substrate may be removed, by the robot, from the FOUP 113 and placed on, for example, one of the left-mounted substrate carriers 307. (Recall, with reference again to FIG. 3, that the left-mounted substrate carriers 307 may be considered as dirty-substrate carriers and the right-mounted substrate carriers 305 may be considered as clean-substrate carriers). Using one of the substrate lifters 207, the unprocessed substrate may be placed on a substrate carrier of one of the rotary arms 201 that is now stopped. For example, the unprocessed substrate may be placed on the same substrate carrier 135 from which the processed substrate, described above, was just removed. (Recall, with continued reference to FIG. 3, that each of the substrate carriers on the substrate traverser mechanism 300 is moved laterally at a different elevational height than one another thus avoiding interference between the processed substrate being removed from the process chamber 131 and the unprocessed substrate coming into the process chamber 131.) Alternatively, the unprocessed substrate may be placed on a substrate carrier on the opposite end of the rotary arm 201 from which the processed wafer was removed. In yet another alternative, the unprocessed substrate may be placed on a substrate carrier on either end of any of the rotary arms 201. As a skilled artisan will recognize, additional rotary arms, substrate lifters, and linear substrate carriers may be added further to enhance substrate throughput.

Further, the described design of the clock-arm substrate carrier mechanism 200 and the substrate traverser mechanism 300 allows for each hand-off of a substrate to be a single axis movement. For example, a hand-off requires two components, a first mechanism to transfer the substrate and a second mechanism to receive the substrate. However, as described herein, one of the two mechanisms is not moving (i.e., it is stationary) thus increasing reliability of substrate transfer operations with substantially reduced communications issues between the two mechanisms (e.g., less stringent timing issues since one mechanism is not moving). Thus, the robot always has a relatively fixed location with which to move a substrate. The fixed location is coupled with a generous time interval (due to the rotary arms 201 of the clock-arm substrate carrier mechanism 200 being independent from one another). Consequently, a high throughput of over 500 substrates per hour can readily be achieved. Additionally, except for the robot, all movements discussed herein are single axis allowing the clock-arm substrate carrier mechanism 200 and the substrate traverser mechanism 300 to be produced relatively inexpensively.

Notice that the c-shaped structure of the right-mounted substrate carriers 305 and the left-mounted substrate carriers 307 allows either of the substrate lifters 207 to be raised and lowered without interference from the substrate carriers. As the substrate lifter 207 is raised vertically, fingers of the substrate lifter 207 traverse slots in the substrate carrier 135. As the substrate lifter 207 continues to be raised, the left-mounted substrate carrier 307 can be moved laterally until it is concentric (i.e., centered with) around the fingers of the substrate lifter 207 and, consequently, the semiconductor substrate 311. The substrate lifter 207 then lowers and the semiconductor substrate 311 is then captured and held by the left-mounted substrate carrier 307. Although the c-shaped structure is not required for aspects of the inventive subject matter described herein to function, a skilled artisan will recognize some operational advantages of the c-shaped carrier. Additionally, the skilled artisan will appreciate that, since all of the rotary arms 201 can be moved independently of one another, when one of the arms stops to be either loaded or unloaded, the other arms may continue to move, thereby greatly increasing efficiency and throughput of the overall system.

Figure 4B:
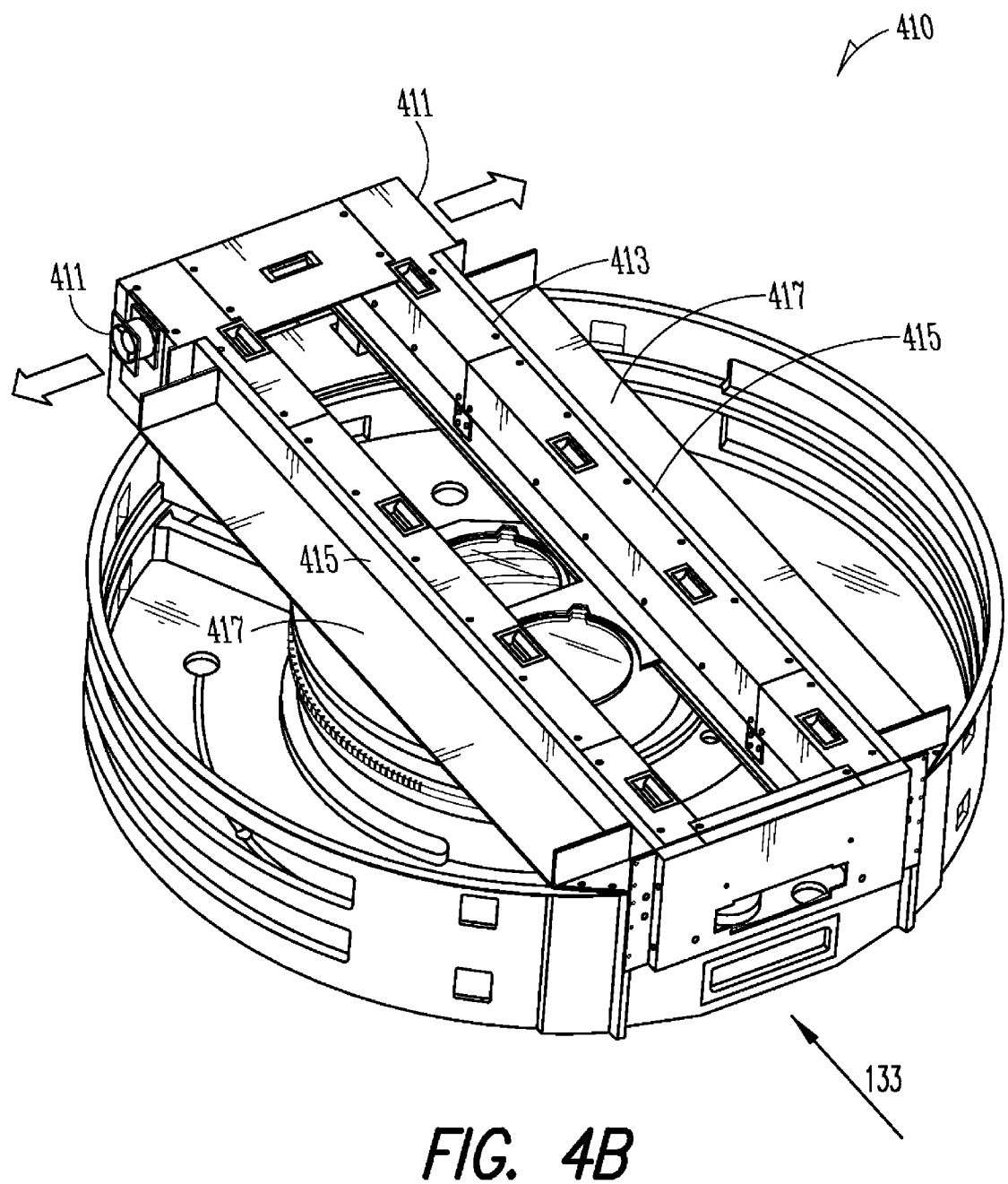
FIG. 4B is a perspective view of the clock-arm substrate carrier mechanism and the substrate traverser mechanism of FIG. 4A with an exemplary embodiment of a traverser duct and cover mechanism.

With reference now to FIG. 4B, a perspective view 410 of the clock-arm substrate carrier mechanism 200 and the substrate traverser mechanism 300 of FIGS. 2 to 4A is shown to include a pair of traverser exhaust fans 411 directing air from around the substrate traverser mechanism 300 to ambient environment. The pair of traverser exhaust fans 411 is coupled to one end of a pair of traverser covers 415, each having an associated pair of traverser cover ducts 413. The pair of traverser cover ducts 413 is in airflow communication with the pair of traverser covers 415 as described in detail with reference to FIG. 4C, below. FIG. 4B is also shown to include a pair of center chamber covers 417. Although not shown explicitly so as to preserve clarity, a pair of chamber lids (not shown) placed above and to the left and right of the pair of center chamber covers 417 separates the clock-arm substrate carrier mechanism 200 (see FIG. 2) from a volume of the process chamber 131 (see FIG. 1B).

Figure 4C:
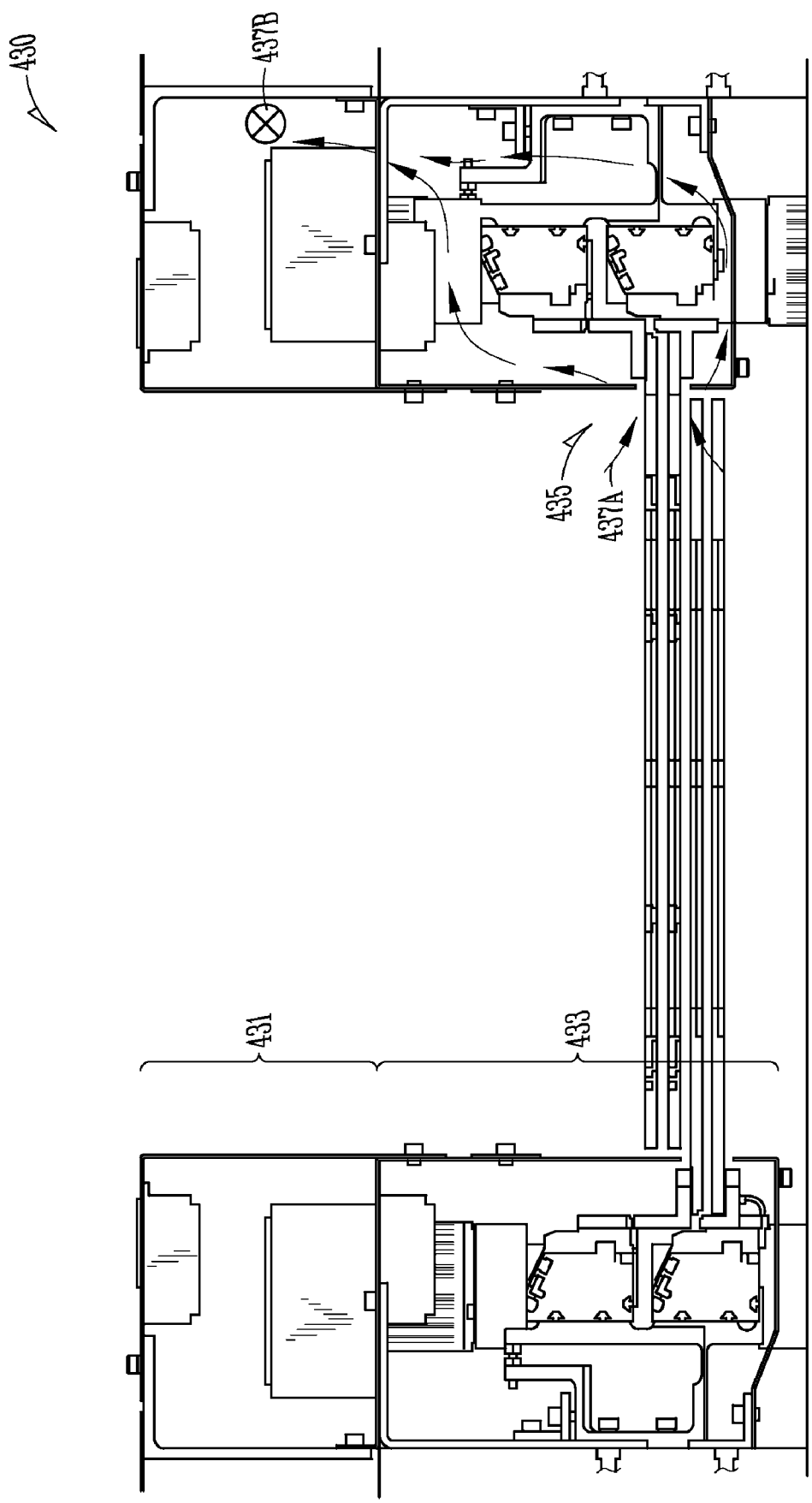
FIG. 4C is a front elevational view of the substrate traverser mechanism of FIG. 3 including the exemplary traverser duct and cover mechanism of FIG. 4B.

With concurrent reference now to FIGS. 3, 4B, and 4C, a front elevational view 430 in FIG. 4C of the substrate traverser mechanism 300 is shown to include a left and right side of the substrate traverser mechanism 300. (The front elevational view 430 is viewed distal to the end of the substrate traverser mechanism 300 on which the pair of traverser exhaust fans 411 is located.) Each side of the front elevational view 430 is substantially symmetrical to one another. However, as will be recognized by a skilled artisan, various element numbers are used separately on either the left or right side of the substrate traverser mechanism 300 to preserve clarity of the description of the elements. A lower traverser volume 433 corresponds to the pair of traverser covers 415 described with reference to FIG. 4B. Correspondingly, an upper traverser volume 431 corresponds to the traverser cover ducts 413. The traverser volumes substantially surround the upper tracks 301 and the lower tracks 303. A pair of slits 435 (only labeled on the right side) is located in the lower traverser volume 433 arranged substantially along the length of the substrate traverser mechanism 300 both above and below the upper tracks 301 and the lower tracks 303. To balance the flow across the pair of slits 435, a number of vertical passages are arranged between the lower traverser volume 433 and the upper traverser volume 431. Each of the traverser volumes may be arranged with differing cross-sectional areas to compensate for pressure drops encountered along the length of the volume. Techniques for balancing the differing cross-sectional areas with the pressure drops are known independently in the art.

An inlet airflow 437A is directed into the pair of slits 435 from the pair of traverser exhaust fans 411 drawing air up and around moving particle-generating mechanisms located on the substrate traverser mechanism 300 within the lower traverser volume 433. As indicated by arrows indicating airflow movement, particles generated within the lower traverser volume 433 are directed to the pair of traverser exhaust fans 411 as indicated by an airflow indicator 437B (directed into the plane of the paper).

In a specific exemplary embodiment, each of the pair of traverser exhaust fans 411 draws about 60 cfm (approximately 1.7 m$^3$ per minute). Each of the pair of slits 435 is approximately 1800 mm in length by 21 mm high, producing an area of about 0.41 feet (approximately 0.038 m$^2$). Coupled with the 60 cfm draw from each of the pair of traverser exhaust fans 411, an airflow velocity is generated at about 2.45 feet per second (approximately 0.75 m per second) or 147 feet per minute (approximately 44.8 m per minute). Thus, using this configuration, the generated airflow velocity for particles sizes less than about 50 µm flows faster than a terminal settling velocity, $V_{TS}$, of the particle size ranges of interest. Particles larger than 50 µm would fall at high enough rates that they could not traverse the horizontal slot. A determination of a required velocity to overcome the terminal settling velocity, $V_{TS}$, as a function of particle size may be approximately determined from, for example, the following equation:

$$V_{TS} = \frac{\rho_p d^2 C_c g}{18\eta};$$

where $\rho_p$ is the density of the particle, d is the particle diameter, $C_c$ is the Cunningham slip correction factor (which is itself a function of particle diameter and the mean-free-path of the carrying gas), g is acceleration due to gravity, and $\eta$ is the coefficient of viscosity for the gas. Although generalized for particle motion in the Stokes regime (i.e., where inertial forces are negligible as compared with viscous forces, for example, in a regime with a Reynolds number less than 1), a skilled artisan will recognize that particles in other regimes may be characterized with other governing equations.

Figure 5A:
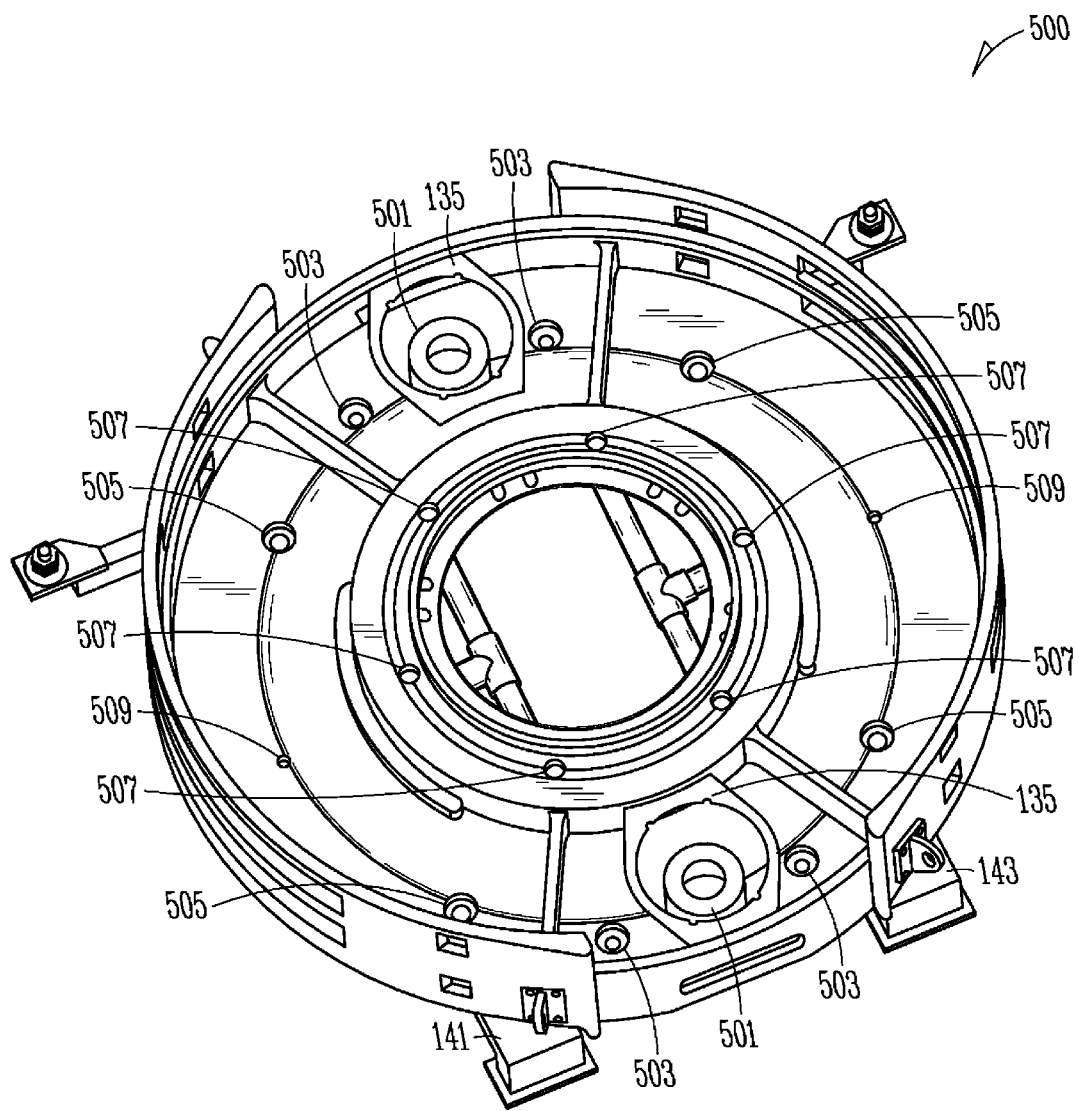
FIG. 5A is a perspective view of a lower portion of the process chamber showing exemplary process chamber exhaust and drain locations used with the exemplary clock-arm substrate carrier mechanism and the substrate traverser mechanism of FIG. 4A and located within the process module of FIG. 1B.

Referring now to FIG. 5A, a perspective view of a lower chamber portion 500 of the process chamber 131 (see FIG.

1B) shows exemplary process chamber exhaust and drain locations used with the exemplary clock-arm substrate carrier mechanism and substrate traverser mechanism of FIG. 4. Although not actually a part of the exhaust or drain system, the lower chamber portion 500 is shown to include a pair of openings 501 for the substrate lifters 207 (see FIG. 2). Since the pair of openings 501 is not part of the exhaust or drain system, they are primarily shown for completeness of FIG. 5A although an airflow of, for example, about 50 cfm (approximately 1.4 m$^3$ per minute) may be drawn through each of the pair of openings 501 to further reduce potential contamination on the substrates.

The lower chamber portion 500 is also shown to include a number of outer traverser exhaust ports 503A, 503B, a number of process exhaust ports 505A, 505B, a number of inner traverser exhaust ports 507A, 507B and a pair of process drain ports 509. The various exhaust ports and drain ports are arranged to allow airflow from the FFU 137 (see FIG. 1B) to reduce particulate counts within the process chamber 131 as well as provide chemical containment. Additional details are provided with reference to FIGS. 7A-7G, below, regarding analysis of the airflow and pressure gradients within the process chamber 131.

Figure 5B:
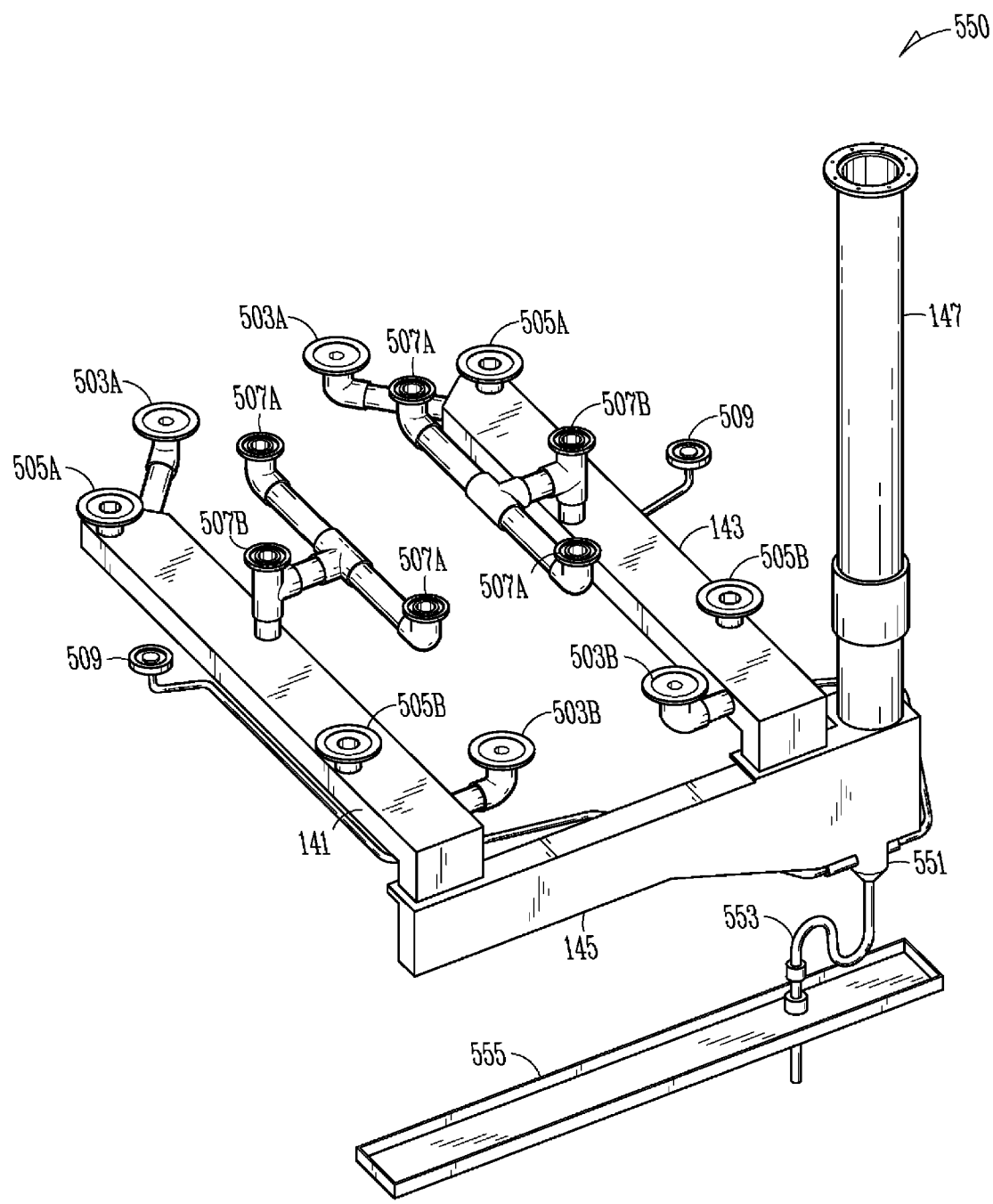
FIG. 5B is a perspective view showing an exemplary process chamber exhaust and drain system used within the process module of FIG. 1B.

FIG. 5B shows a perspective view of an exemplary process chamber exhaust and drain system 550 arranged to mechanically couple below the lower chamber portion 500 of FIG. 5A. FIG. 5B thus provides a skilled artisan with a better understanding of how various ones of the exhaust ports and drain ports of FIG. 5A are interconnected in relationship with the process module 130 of FIG. 1B. The process chamber exhaust and drain system 550 is also shown to include an inlet process-drain manifold 551, a p-trap 553, and a secondary containment tray 555. The inlet process-drain manifold 551 couples each of the process drain ports together below the cross-tube assembly 145. The p-trap 553 provides a substantially gas-tight seal formed by standing liquid within a lowermost portion of the p-trap 553. The standing liquid prevents any gases from a connection to the fabrication facility from back flowing into the process chamber 131 and thus reduces any chemical or other contamination from a back-flowed gas. The secondary containment tray 555 catches liquids that might otherwise leak or drip from the process module 130. In an exemplary embodiment, polyvinylidene difluoride (PVDF) materials can be utilized for the chemical drain lines while chlorinated polyvinyl chloride (CPVC) materials can be utilized for the various airflow lines. A skilled artisan will recognize that other materials, known independently in the art, may be employed as well.

In a specific exemplary embodiment, about 120 cfm (approximately 3.4 m$^3$ per minute) of volumetric airflow is drawn from each of the chemical zones from the process chambers 131 plus an additional 160 cfm (approximately 4.5 m$^3$ per minute) from non-chemical zones of both of the process chambers 131 (combined) for a total of about 400 cfm (approximately 11 m$^3$ per minute) from the chambers. In addition to reducing particulate contamination on the substrates within the process chambers 131, the airflow further helps reduce chemical overflow from one chamber to another and also thus reduces the amount of chemical vapor that might otherwise escape into the fabrication facility. In this specific exemplary embodiment, the total airflow can at least partially be broken down as follows. Each of the outer traverser exhaust ports 503A draw about 24 cfm (approximately 0.68 m$^3$ per minute) and the outer traverser exhaust ports 503B each draw a 26 cfm (approximately 0.74 m$^3$ per minute). Each of the inner traverser exhaust ports 507A draw about 12.5 cfm (approximately 0.35 m$^3$ per minute) and the inner traverser exhaust ports 507B each draw about 25 cfm (approximately 0.71 m$^3$ per minute). The process exhaust ports 505A each draw about 48 cfm (approximately 1.4 m$^3$ per minute) and the process exhaust ports 505B each draw about 52 cfm (approximately 1.5 m$^3$ per minute).

A negative gauge pressure of about 0.5 inches H$_2$O (approximately 0.9 torr) exists near each of the process exhaust ports 505A in the first chamber exhaust pipe 141 and the second chamber exhaust pipe 143 with a slightly more negative gauge pressure of about 0.6 inches H$_2$O (approximately 1.1 ton) that exists in exhaust pipes near each of the process exhaust ports 505B. An exhaust pressure entering the cross-tube assembly 145 from the first chamber exhaust pipe 141 is about 0.8 inches H$_2$O (approximately 1.5 ton) with a slightly more negative pressure of about 1.2 inches H$_2$O (approximately 2.2 ton) entering the cross-tube assembly 145 from the second chamber exhaust pipe 143. The process drain ports 509 each draw about 6 cfm (approximately 0.17 m$^3$ per minute). The negative exhaust pressure at a connection of the chamber exhaust stack 147 to a facility interface is about 1.7 inches H$_2$O (approximately 3.2 ton) at about 400 cfm (approximately 11 m$^3$ per minute) of volumetric draw. Although not shown explicitly, a pressure sensor may be utilized within the chamber exhaust stack 147 to verify chamber airflow. The pressure sensor can be hard-wired to the processing tool 100 at, for example, the first operator control interface 115A (see FIG. 1a) to prevent either system start-up or continued operation should the negative exhaust pressure fall below a predefined level.

Figure 6:
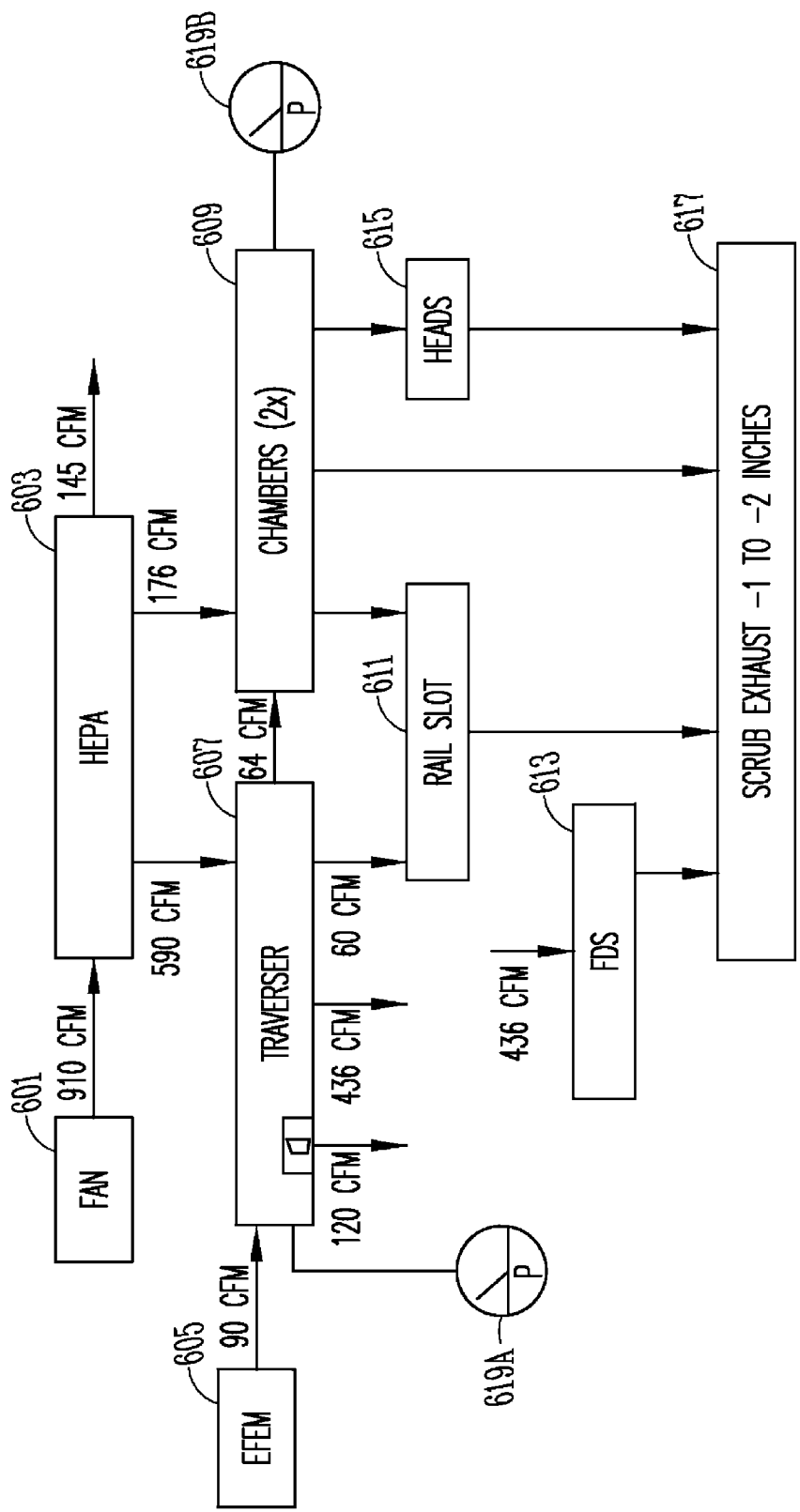
FIG. 6 is an exemplary air handling schematic showing volumetric flow rates into and out from the EFEM and the process module of FIG. 1A.

Referring now concurrently to FIG. 1B and FIG. 6, an exemplary air handling schematic shows volumetric air flow rates into and out from the EFEM 110 and the process module 130 of FIG. 1A. A skilled artisan will recognize that all volumetric flow rates are approximate only and are given as an aid to understanding an overall design of the system. Other flow rates can be employed. In this exemplary embodiment, a volumetric flow rate of 910 cfm (approximately 25.8 m$^3$ per minute) is generated by one or more fans 601 into a HEPA filter 603 (both of which are within the FFU 137). From the original 910 cfm, roughly 590 cfm (approximately 16.7 m$^3$ per minute) flows directly across a traverser volume 607, 176 cfm (approximately 4.98 m$^3$ per minute) flows into chamber volumes 609, and 145 cfm (approximately 4.10 m$^3$ per minute) of clean excess airflow returns to the facility ambient through a perimeter slit 753 (see FIG. 7B, below) under a hood coupled below the FFU 137. In an exemplary embodiment, the perimeter slit 753 is about 12 mm in height and formed around the perimeter of the hood. The excess airflow through the perimeter slit 753 has an exit velocity of about 1 m per second and helps assure that sufficient airflow is available at all times to the traverser and chamber volumes should the one or more fans 601 have a reduced volumetric air output.

With continued reference to FIG. 1B and FIG. 6, an EFEM port 605 adds another 90 cfm (approximately 2.5 m$^3$ per minute) into the traverser volume 607, thus maintaining a pressure on any semiconductor substrates 311 (see FIG. 3) located on the substrate load stations (see FIG. 1A) to be at a higher pressure than the traverser volume 607 and reducing or preventing any chemical or particulate contamination from back-flowing from the process chambers 131 into the EFEM 110 and, consequently, into the fabrication facility. The traverser volume 607 is maintained at a positive pressure with reference to the chamber volumes 609. The pressure is monitored by a traverser pressure gauge 619A. The traverser pressure gauge 619A may be electronically coupled to one of the operator control interfaces (e.g., the first operator control interface 115A of FIG. 1A).

Due to the positive pressure within the traverser volume 607, 64 cfm (approximately 1.8 m³ per minute) of air flows from the traverser volume 607 into the chamber volumes 609 and 60 cfm (approximately 1.7 m³ per minute) of air flows into the rail slot volume 611 (containing the inner track section 203 and the outer track section 205, see FIG. 2). The 64 cfm volumetric airflow is generally in the same plane as the carriers and is kept at a velocity that prevents much turbulence in the chamber, but is at a greater velocity than the carrier velocity to prevent chemical vapor from being dragged out, between about 3 feet per second and 10 feet per second (approximately 1 m per second and 3 m per second). Since the inner track section 203 and the outer track section 205 mechanically guide the rotary arms 201, some particulate contamination is generated where the respective surfaces of the sliding members meet. Therefore, the 60 cfm of airflow provides airflow to scrub particles from the rail slot volume 611 into a scrubbed exhaust 617. The scrubbed exhaust 617 is maintained at a negative pressure with reference to the remainder of the system at about 1 to 2 inches of $H_2O$ (approximately 1.9 to 3.7 ton). The traverser volume 607 generates another 120 cfm from the pair of traverser exhaust fans 411 (see FIG. 4B). FIG. 6 indicates the 120 cfm (approximately 3.4 m³ per minute) is dissipated to ambient. However, a skilled artisan will recognize that the exhaust from the pair of traverser exhaust fans 411 may optionally be directed to a floor-drain system volume 613. The remaining 436 cfm (approximately 12.3 m³ per minute) generated into the traverser volume 607 is directed into the floor-drain system volume 613.

With reference again to the chamber volumes 609, the chamber volumes 609 are also monitored by a chamber pressure gauge 619B. The traverser pressure gauge 619A and the chamber pressure gauge 619B assures that particulate contamination and chemical contamination are properly swept from the traverser volume 607 and chamber volumes 609, respectively as indicated, above.

Of the 240 cfm (approximately 6.8 m³ per minute) entering the chamber volumes 609, an adjustable portion of the airflow is directed to the chemical head volumes 615 (relating to the chemical release heads of FIG. 2) and the rail slot volume 611 with an excess flow being directed to the scrubbed exhaust 617. Other than the 145 cfm of clean excess airflow returning to the facility ambient through the perimeter slit 753, substantially all other airflow (which is potentially contaminated by chemicals or particulates) returns through a floor drain system (FDS) 613 within the facility or the scrubbed exhaust 617.

Figure 7A:
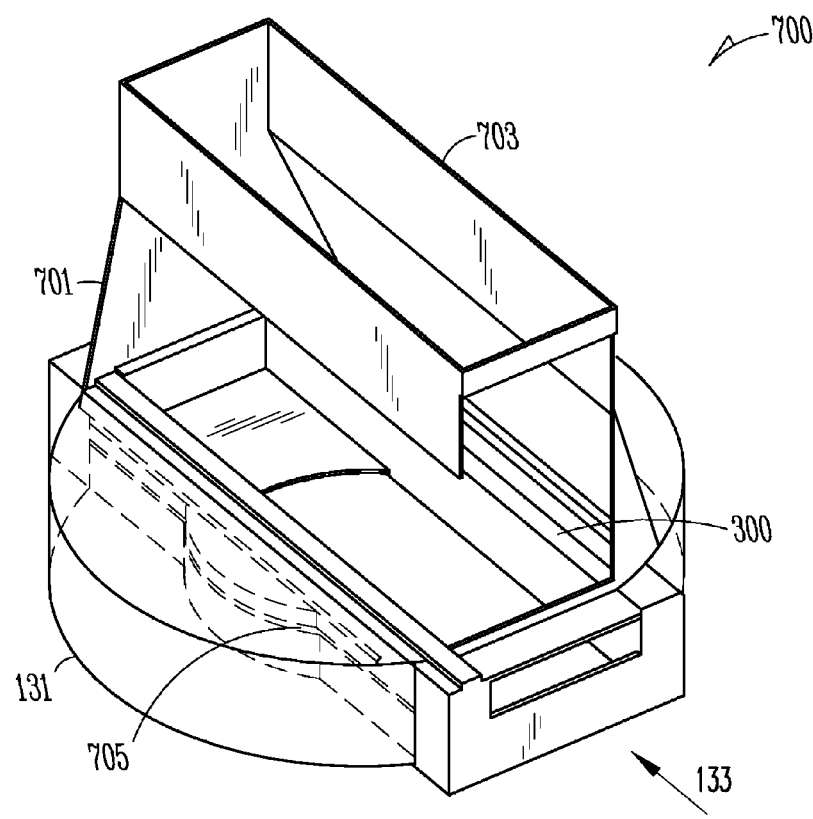
FIG. 7A is an exemplary perspective view and an exemplary plan view of solid components of the process chamber of FIG. 1B used in computational fluid dynamic (CFD) modeling.
Figure 7A:
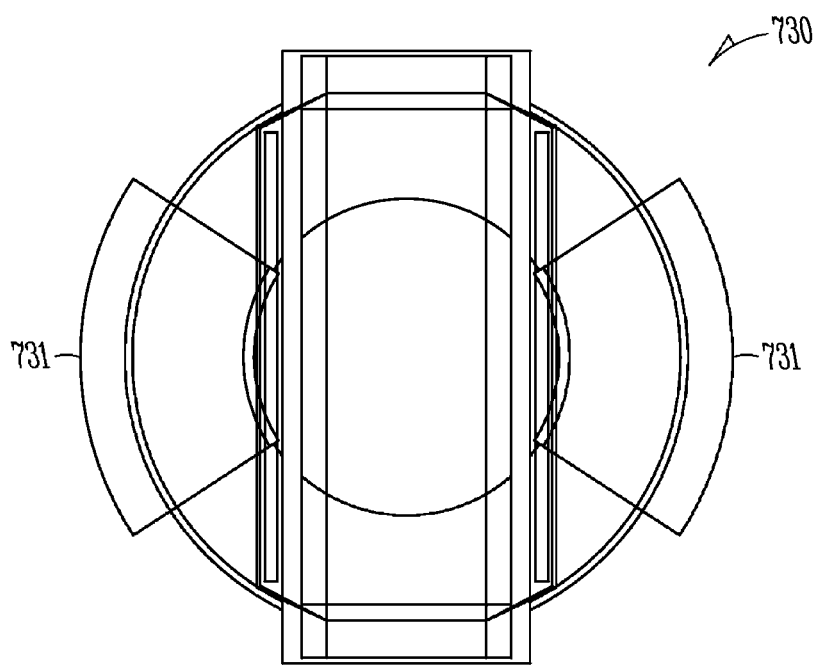

Referring now to FIG. 7A and with continuing reference to FIG. 6, an exemplary perspective view 700 (partially cut away) and an exemplary plan view 730 of solid components of the process chamber 131 of FIG. 1B is shown. The solid components are used in computational fluid dynamic (CFD) modeling of various airflows and pressure gradient determinations as described above with reference to FIG. 5B and FIG. 6. The exemplary perspective view 700 is shown to include a housing area 703 for the FFU 137 (see FIG. 1B) including the one or more fans 601 and the HEPA filter 603. A hood 701 couples airflow from the housing area 703 to the substrate traverser mechanism (not shown explicitly so as to preserve clarity) and into the process chamber 131. A carrier-arm passage slot 705 helps preserve a higher pressure in the traverser volume 607 relative to the chamber volumes 609 thus aiding in chemical containment of outer portions of the process chamber 131. The rotary arms 201 of FIG. 2 move through the carrier-arm passage slot 705 during operation. The exemplary plan view 730 is shown to include chemical areas 731 in which the chemical heads of FIG. 2 may be located.

Figure 7B:
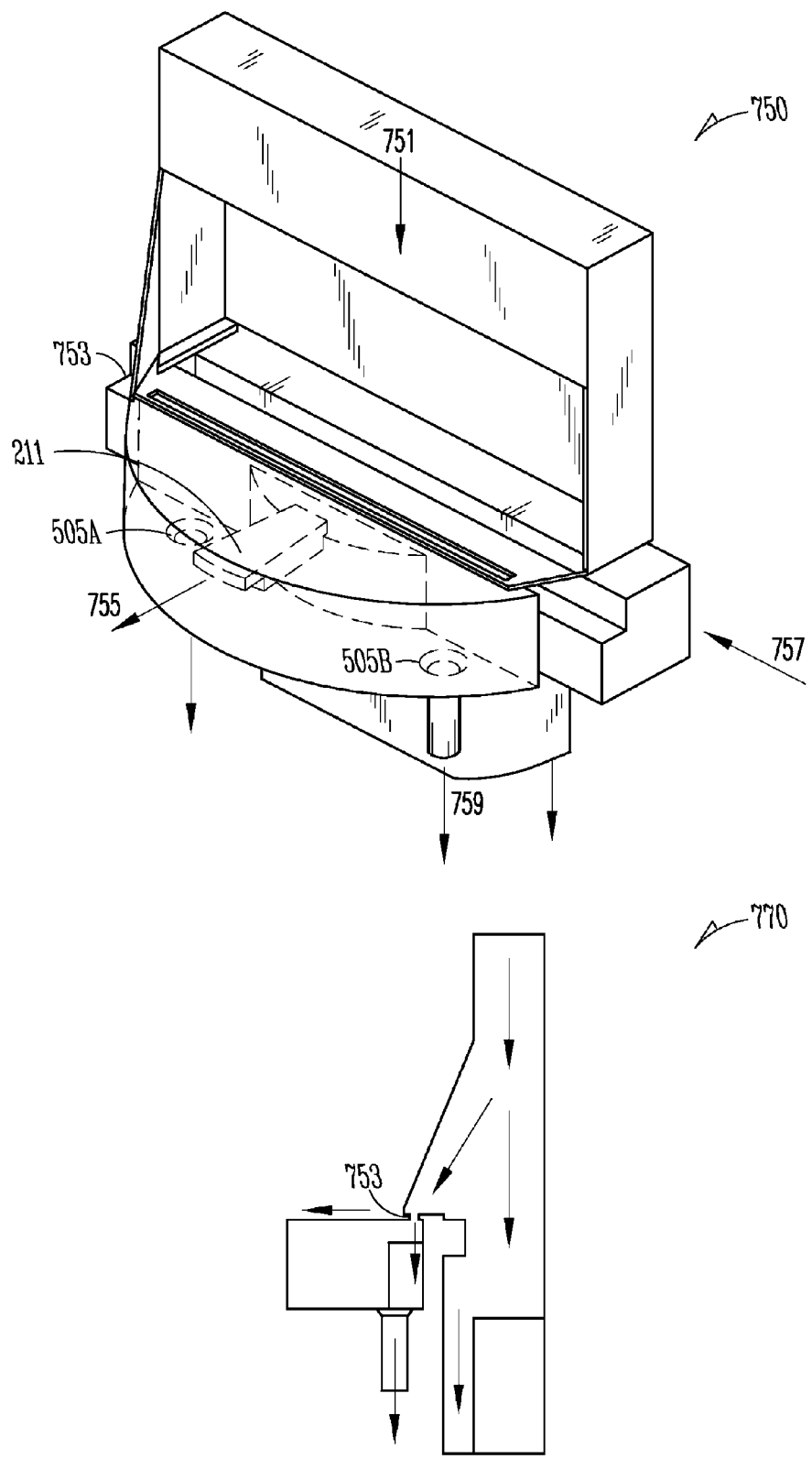
FIG. 7B is a perspective view and a side elevational view (both views on one side of a line of symmetry) of a fluid domain of the process chamber of FIG. 1B used in the computational fluid dynamic modeling utilizing the solid components of FIG. 7A.

With reference now to FIG. 7B, a perspective view 750 and a side elevational view 770 (both views on one side of a line of symmetry) show a fluid domain of the process chamber of FIG. 1B used in the computational fluid dynamic modeling utilizing the solid components of FIG. 7A. FIG. 7B provides an overall understanding of the various CFD model flow diagrams and pressure diagrams that follow. In general terms, a combination of a primary air inlet 751 from the FFU 137 and a secondary air inlet 757 from the EFEM 110 delivers airflow into the process chamber 131 of FIG. 1B. The perimeter slit 753, described above with reference to FIG. 6, provides a clean excess airflow 755 back into the fabrication facility. The upper chemical-release head 211 and process exhaust ports 505A, 505B are shown to assist a skilled artisan in understanding relationships between components of the various figures described herein (e.g., FIGS. 1B-5B). As discussed with reference to FIG. 6, each of the various exhaust airflows described above are eventually substantially routed to an FDS outlet, thus providing for an exhaust airflow outlet 759.

Figure 7C:
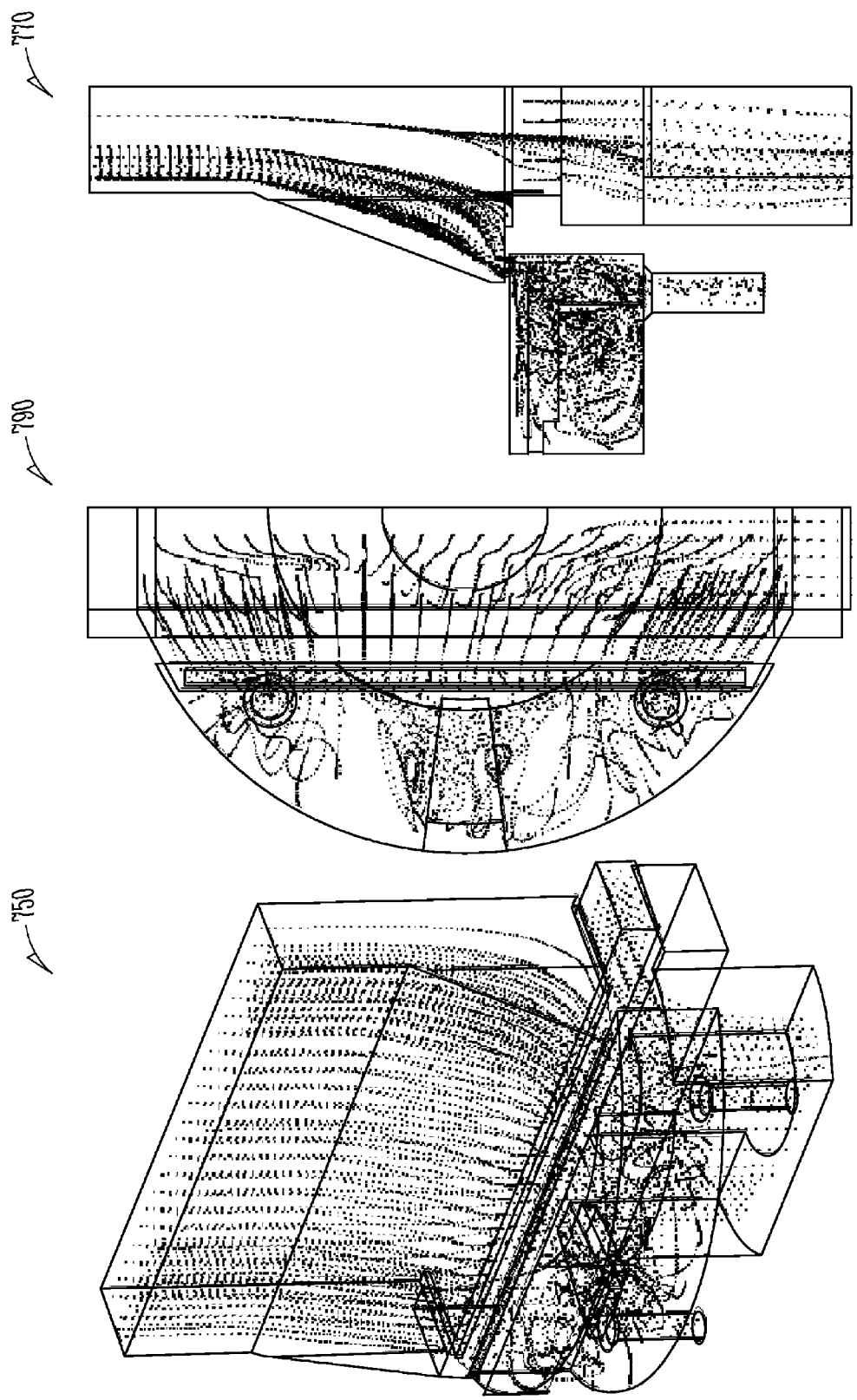
FIG. 7C is a computed particle trace for a perspective view, a plan view, and a side elevational view (all three views on one side of a line of symmetry) of general air flow motion within the process chamber of FIG. 1B.

FIG. 7C through FIG. 7H are included as an aid to assist a artisan skilled in CFD modeling techniques to more fully understand and appreciate various aspects of the inventive subject matter described with reference to FIG. 5B and FIG. 6, above. For example, FIG. 7C shows a computed particle trace for a perspective view 750, a plan view 790, and a side elevational view 770 (all three views on one side of a line of symmetry) within the fluid domain of general airflow motion within the process chamber of FIG. 1B. A skilled artisan will recognize that the computed particle trace confirms the generalized descriptions given above with regard to the air handling schematic of FIG. 6.

Figure 7D:
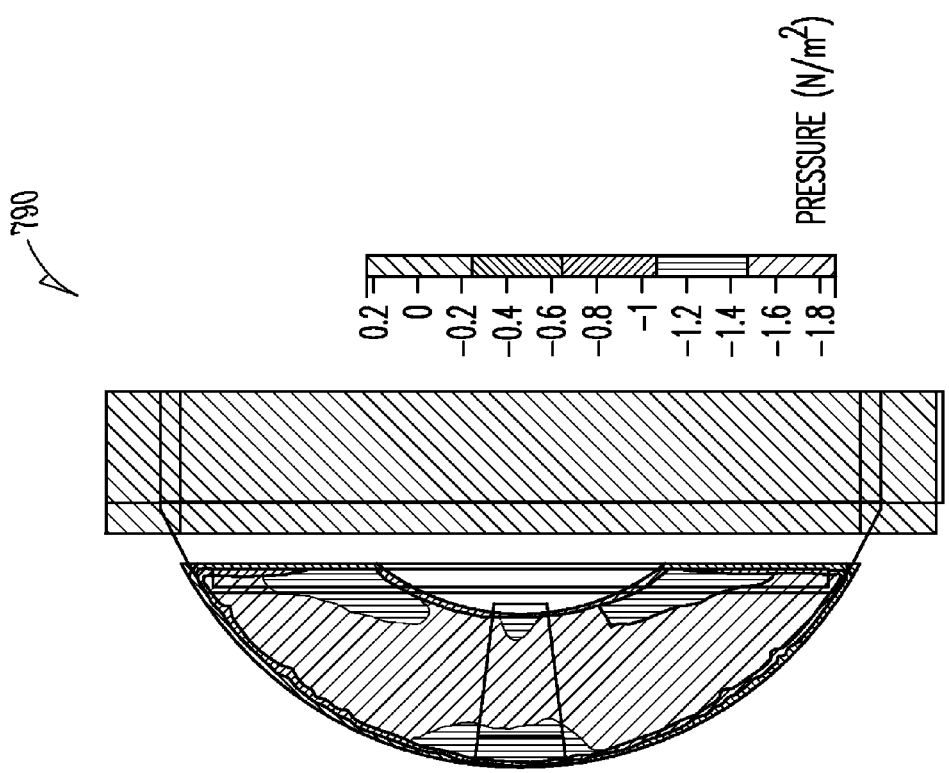
FIG. 7D is a computed pressure field for a perspective view and a plan view (both views on one side of a line of symmetry) to verify locations of negative pressure within the process chamber of FIG. 1B.
Figure 7D:
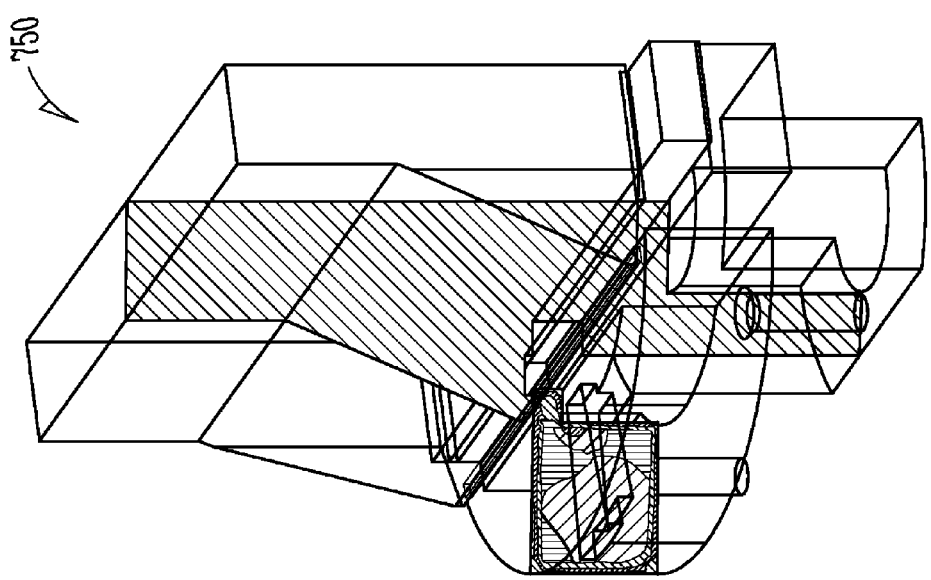

FIG. 7D shows a computed pressure field for a perspective view 750 and a plan view 790 (both views on one side of a line of symmetry) to verify locations of relative pressure differences within the process chamber 131. The computed pressure field verifies, for example, both particulate and chemical confinement regions. Both chemical vapors and smaller particulates (e.g., less than 50 µm) are substantially contained in areas having reduced pressure (i.e., a more negative pressure relative to other surrounding volumes).

Figure 7F:
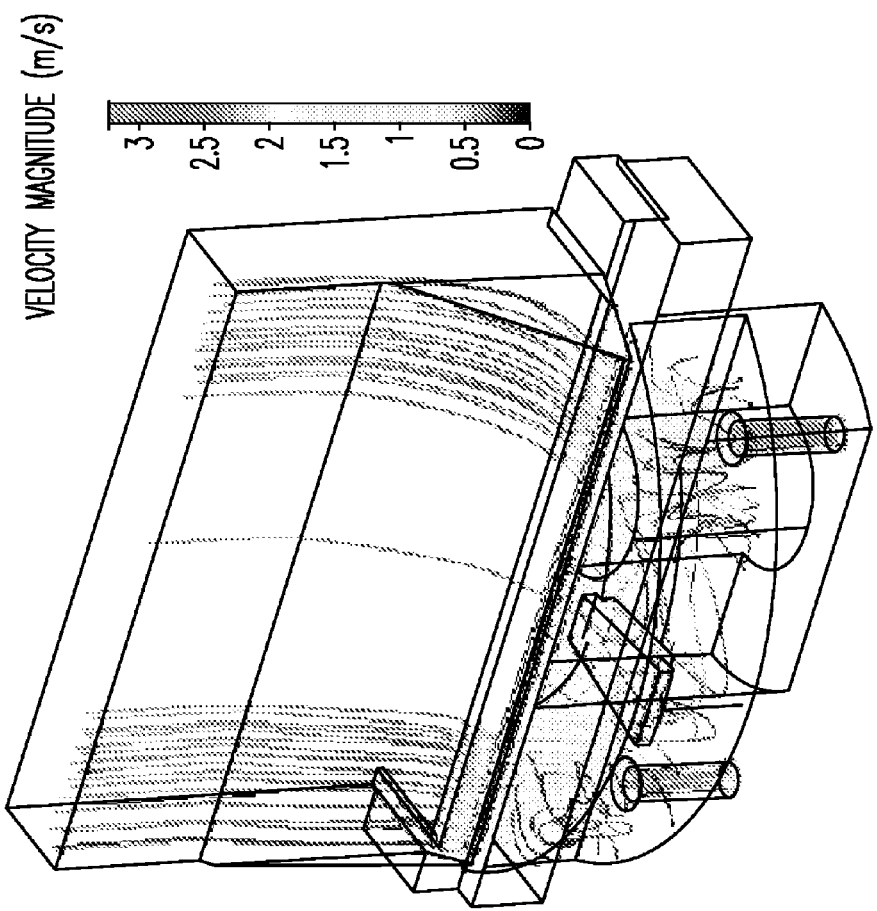
FIG. 7F is a computed velocity flow field for a perspective view (on one side of a line of symmetry) of general air flow motion from a hood slit in the chamber inlet within the process chamber of FIG. 1B to outlet locations as indicated by FIGS. 5A and 5B.
Figure 7E:
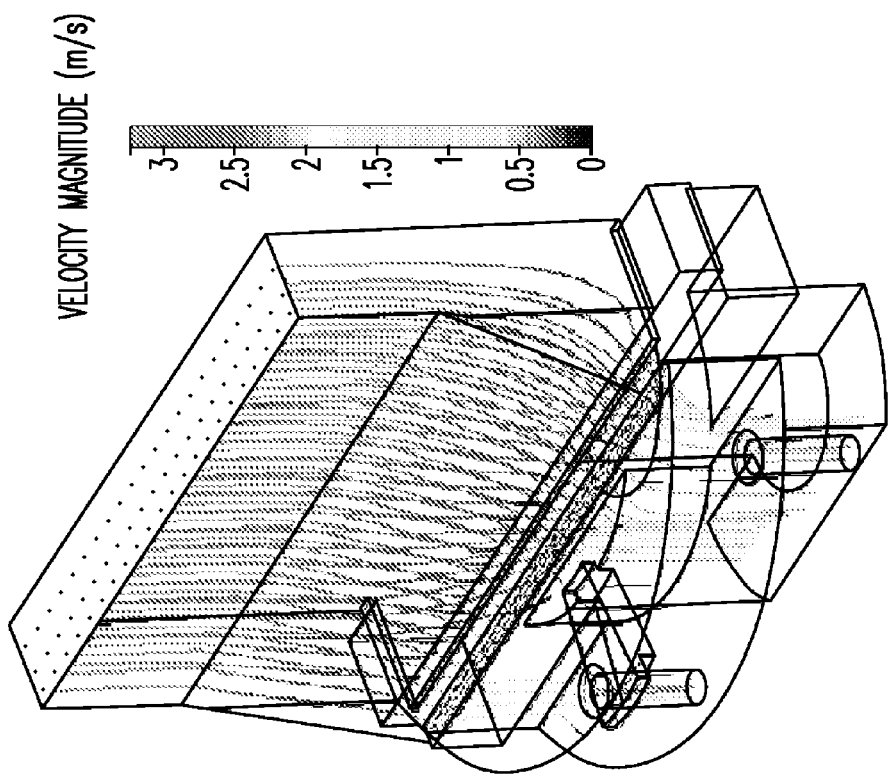
FIG. 7E is a computed velocity flow field for a perspective view (on one side of a line of symmetry) of general air flow motion from a high-efficiency particulate air filter (HEPA) inlet within the process chamber of FIG. 1B.

FIG. 7E shows a computed velocity flow field for a perspective view (on one side of a line of symmetry) of general air flow motion from the HEPA inlet within the process chamber while FIG. 7F similarly shows general air flow motion from a hood slit in the chamber inlet to the various outlets.

Figure 7H:
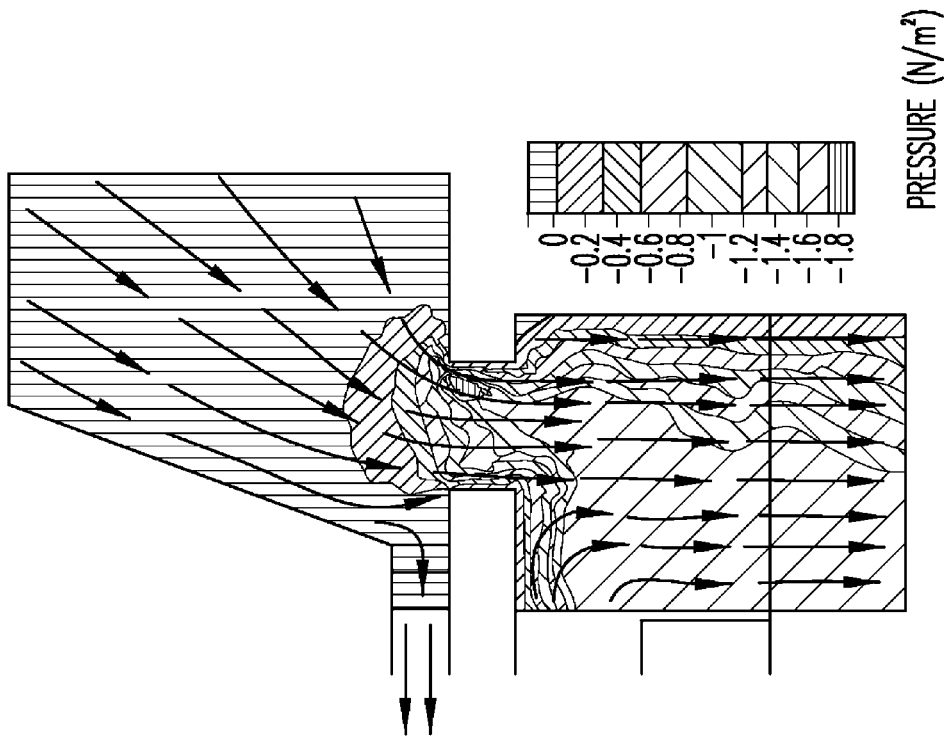
FIG. 7H is a computed pressure field for a side elevational view (on one side of a line of symmetry) of pressure gradients from the HEPA inlet and the hood slit within the process chamber of FIG. 1B.
Figure 7G:
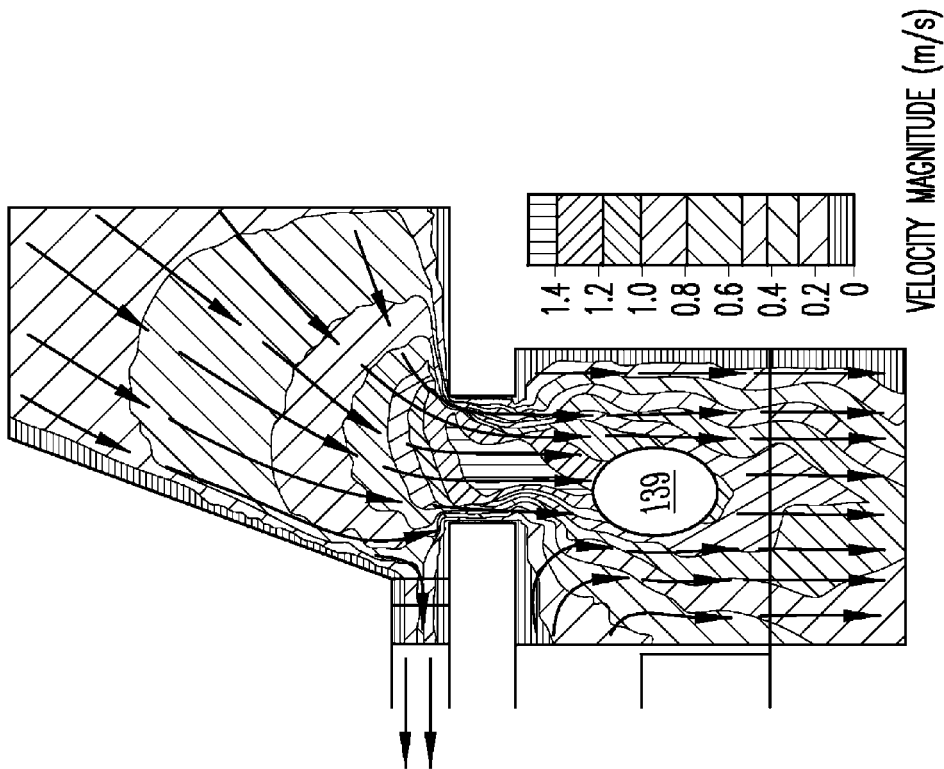
FIG. 7G is a computed velocity flow field for a side elevational view (on one side of a line of symmetry) of general air flow motion from the HEPA inlet and the hood slit around a chamber ionizer bar within the process chamber of FIG. 1B.

FIG. 7G shows a computed velocity flow field for a side elevational view (on one side of a line of symmetry) of general air flow motion from the HEPA inlet and the perimeter slit 753 (see FIG. 7B) around one of the ionizer bars 139 within a portion of the process chamber. Similarly, FIG. 7H shows a computed pressure field for a side elevational view (on one side of a line of symmetry and without the ionizer bars 139) of pressure gradients from the HEPA inlet and the perimeter slit 753 within the process chamber.

A skilled artisan will appreciate that each of the computed flow and pressure fields shown by the flow and pressure diagrams of FIGS. 7B through 7H are to be considered in light of the physical layout of the exemplary process chamber exhaust and drain system of FIG. 5B and the exemplary air handling schematic of FIG. 6 to more fully understand the various exemplary embodiments described herein. A skilled artisan will further recognize, given the various descriptions provided herein, that the exemplary system for airflow management in a process tool can be implemented on various tools and at multiple points in a process line. The skilled artisan will further recognize that the system can readily be incorporated into a plurality of both process and metrology tools in various portions of a typical fabrication facility (e.g., in front-end-of-line, back-end-of-line, and test operations).

Moreover, although an overview of the inventive subject matter has been described with reference to specific exemplary embodiments, various modifications and changes may be made to these embodiments without departing from the broader spirit and scope of aspects of the inventive subject matter. Such embodiments of the inventive subject matter may be referred to herein, individually or collectively, by the term "invention" merely for convenience and without intending to voluntarily limit the scope of this application to any single invention or inventive concept if more than one is, in fact, disclosed. The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and a scope of various embodiments is defined only by the appended claims, along with the full range of equivalents to which such claims are entitled.

Moreover, plural instances may be provided for structural elements or operations described herein as a single instance. Other allocations of functionality are envisioned. The other allocations may fall within a scope of various embodiments of the present inventive subject matter. In general, structures and functionality presented as separate resources in the exemplary configurations may be implemented as a combined structure or resource. Similarly, structures and functionality presented as a single resource may be implemented as separate resources.

Additionally, many industries allied with the semiconductor industry could make use of the systems and techniques described herein. For example, a thin-film head (TFH) process in the data storage industry, an active matrix liquid crystal display (AMLCD) in the flat panel display industry, or the micro-electromechanical (MEM) industry could readily make use of the systems and techniques described. The term "semiconductor" should thus be recognized as including the aforementioned and related industries. These and other variations, modifications, additions, and improvements fall within a scope of the present invention as represented by the appended claims. The specification and drawings are, accordingly, to be regarded in an illustrative rather than a restrictive sense.

What is claimed is:

1. A system to reduce particle contamination on substrates, the system comprising:
   a substrate traverser mechanism having one or more tracks to transport substrate carriers;
   one or more traverser ducts arranged to at least partially surround the one or more tracks, the one or more ducts having slits along at least a substantial portion of a length of the one or more tracks, the slits arranged above and below the one or more tracks; and
   a traverser exhaust fan coupled to one end of each of the one or more traverser ducts, the traverser exhaust fan to provide sufficient volumetric airflow to provide a velocity of the volumetric airflow in a direction away from the substrate carriers on the one or more tracks through the slits greater than a terminal settling velocity of a predetermined particle size, the traverser exhaust fan further to draw particles less than about the predetermined particle size generated by the substrate traverser mechanism into the one or more traverser ducts.

2. The system of claim 1, wherein the one or more traverser ducts have a differing cross-sectional area along the length to balance a pressure drop from the traverser exhaust fan allowing a substantially uniform airflow velocity along a length of the slits.

3. The system of claim 1, wherein the terminal settling velocity is determined for the predetermined particle size being less than about 50 µm.

4. A system to reduce particle contamination on substrates, the system comprising:
   a housing to couple a substrate production tool to a fan filter unit, the fan filter unit to provide filtered air to the housing;
   a facility connection to couple the substrate production tool to a reduced pressure exhaust mechanism;
   a substrate transfer section coupled below the housing and in airflow communication with the facility connection, the substrate transfer section partially containing a clock-arm substrate carrier mechanism having a plurality of carrier arms each having a midpoint and a respective drive between opposing ends and arranged to rotate about the midpoint in planes parallel to one another, the respective drive coupled to each of the plurality of carrier arms to move respective ones of the plurality of carrier arms in at least a 360 degree arc in either direction simultaneously, the substrate transfer section further having a linear substrate traverser mechanism having a plurality of linear substrate carriers mounted thereon, each of the plurality of linear substrate carriers being configured to transport the substrates in a plane substantially parallel to the planes of the plurality of carrier arms with each of the plurality of linear substrate carriers being in a different plane from one another;
   a substrate process area coupled to the substrate transfer section by one or more substrate transport slots, the clock-arm substrate carrier mechanism being arranged to transport the substrates between the substrate process area and the substrate transfer section via the one or more substrate transport slots; and
   a chamber substantially containing the substrate transfer section and the substrate process area, the chamber being coupled to the housing to receive the filtered air and coupled to the facility connection to provide an exhaust for excess gas flow, the chamber being configured to maintain a low pressure in the substrate process area relative to the substrate transfer section.

5. The system of claim 4, further comprising at least one peripheral substrate transport slot positioned proximal to an outer periphery of a rotational path traversed by the plurality of carrier arms and to one end of the linear substrate traverser mechanism.

6. The system of claim 5, wherein the at least one peripheral substrate transport slot is configured to receive the substrates into and out from the chamber from a substrate enclosure, the at least one peripheral substrate transport slot to be maintained at a low pressure relative to the substrate enclosure.

7. The system of claim 4, wherein the linear substrate traverser mechanism is operationally coupled above the plurality of carrier arms.

8. The system of claim 4, wherein the linear substrate traverser mechanism further comprises:
   at least two upper tracks;
   at least two lower tracks; and linear drive mechanisms respectively coupled to each of the at least two upper tracks and the two lower tracks, each of the plurality of linear substrate carriers mechanically coupled to a unique one of the linear drive mechanisms.

9. The system of claim 8, wherein the linear substrate traverser mechanism is positioned between the housing and the facility connection, a volume in which the linear substrate traverser mechanism operates is configured to be at a higher pressure than a pressure at the facility connection to draw particles generated by the linear drive mechanisms into the reduced pressure exhaust mechanism during operation.

10. The system of claim 4, wherein the one or more substrate transport slots are arranged to maintain the low pressure in the substrate process area relative to the substrate transfer section.

11. The system of claim 4, wherein the chamber is further configured to maintain a high pressure in the substrate transfer section relative to the facility connection.

12. The system of claim 4, wherein the chamber is further configured to maintain a high pressure in the substrate process area relative to the facility connection.

13. The system of claim 4, wherein the substrate transfer section and the substrate process area are located substantially horizontal relative to one another.

14. The system of claim 4, wherein the facility connection is located below the substrate transfer section.

15. The system of claim 4, wherein the chamber further includes a substrate port to receive the substrates into and out from the chamber from a substrate enclosure, the substrate port to be maintained at a low pressure relative to the substrate enclosure.

16. The system of claim 4, wherein the substrate process area includes a chemical process section.

17. The system of claim 16, wherein the chamber being configured to maintain a low pressure in the substrate process area relative to the substrate transfer section is to substantially contain chemical vapors within the chemical process section from reaching the substrate transfer section.

18. A system to reduce particle contamination on wafers in a wafer process tool, the system comprising:
 a fan filter unit to provide filtered air to the wafer process tool;
 a facility connection to couple the wafer process tool to a reduced pressure exhaust mechanism of a wafer fabrication facility;
 a wafer transfer section coupled below the fan filter unit and in airflow communication with the facility connection, the wafer transfer section partially containing a clock-arm wafer carrier mechanism having a plurality of carrier arms each having a midpoint and a respective drive between opposing ends and arranged to rotate about the midpoint in planes parallel to one another, the respective drive coupled to each of the plurality of carrier arms to move respective ones of the plurality of carrier arms in at least a 360 degree arc in either direction simultaneously, the wafer transfer section further having a linear wafer traverser mechanism having a plurality of linear wafer carriers mounted thereon, each of the plurality of linear wafer carriers being configured to transport the wafers in a plane substantially parallel to the planes of the plurality of carrier arms with each of the plurality of linear wafer carriers being in a different plane from one another;
 a wafer process area coupled to the wafer transfer section by one or more wafer transport slots, the clock-arm wafer carrier mechanism being arranged to transport the wafers between the wafer process area and the wafer transfer section via the one or more wafer transport slots; and
 a process chamber substantially containing the wafer transfer section and the wafer process area, the process chamber being coupled to the fan filter unit to receive the filtered air and coupled to the facility connection to provide an exhaust for excess gas flow, the process chamber being configured to maintain a low pressure in the wafer process area relative to the wafer transfer section.

19. The system of claim 18, wherein the wafer process area includes a chemical process section.

20. The system of claim 19, wherein the process chamber being configured to maintain a low pressure in the wafer process area relative to the wafer transfer section is to substantially contain chemical vapors within the chemical process section from reaching the wafer transfer section.

21. The system of claim 18, wherein the one or more wafer transport slots are arranged to maintain the low pressure in the wafer process area relative to the wafer transfer section.

22. The system of claim 18, wherein the process chamber is further configured to maintain a high pressure in the wafer transfer section relative to the facility connection.

23. The system of claim 18, wherein the process chamber is further configured to maintain a high pressure in the wafer process area relative to the facility connection.

24. The system of claim 18, wherein the wafer transfer section and the wafer process area are located substantially horizontal relative to one another.

25. The system of claim 18, wherein the facility connection is located below the wafer transfer section.

26. The system of claim 18, further comprising at least one peripheral wafer transport slot positioned proximal to an outer periphery of a rotational path traversed by the plurality of carrier arms and to one end of the linear wafer traverser mechanism.

27. The system of claim 26, wherein the at least one peripheral wafer transport slot is configured to receive the wafers into and out from the chamber from a wafer enclosure, the at least one peripheral wafer transport slot to be maintained at a low pressure relative to the wafer enclosure.

28. The system of claim 18, wherein the linear wafer traverser mechanism is operationally coupled above the plurality of carrier arms.

29. The system of claim 18, wherein the linear wafer traverser mechanism further comprises:
 at least two upper tracks;
 at least two lower tracks; and
 linear drive mechanisms respectively coupled to each of the at least two upper tracks and the two lower tracks, each of the plurality of linear wafer carriers mechanically coupled to a unique one of the linear drive mechanisms.

30. The system of claim 29, wherein the linear wafer traverser mechanism is positioned between the fan filter unit and the facility connection, a volume in which the linear wafer traverser mechanism operates is configured to be at a higher pressure than a pressure at the facility connection to draw particles generated by the linear drive mechanisms into the reduced pressure exhaust mechanism during operation.

31. A method of reducing particle contamination on substrates, the method comprising:
 providing a housing to couple a substrate production tool to a fan filter unit, the fan filter unit providing filtered air to the substrate production tool;

providing a facility connection to couple the substrate production tool to a reduced pressure exhaust mechanism, the reduced pressure exhaust mechanism providing an exhaust for excess gas flow within the substrate production tool;

providing a substrate transfer section coupled below the housing and in airflow communication with the facility connection, the substrate transfer section partially containing a clock-arm substrate carrier mechanism having a plurality of carrier arms each having a midpoint and a respective drive between opposing ends and arranged to rotate about the midpoint in planes parallel to one another, the respective drive coupled to each of the plurality of carrier arms to move respective ones of the plurality of carrier arms in at least a 360 degree arc in either direction simultaneously, the substrate transfer section further having a linear substrate traverser mechanism having a plurality of linear substrate carriers mounted thereon, each of the plurality of linear substrate carriers being configured to transport the substrates in a plane substantially parallel to the planes of the plurality of carrier arms with each of the plurality of linear substrate carriers being in a different plane from one another;

maintaining a substrate process area of the substrate production tool at a lower pressure than a pressure of the substrate transfer section of the substrate production tool;

maintaining the substrate process area at a higher pressure than a pressure of the reduced pressure exhaust mechanism; and maintaining the substrate transfer section at a higher pressure than the pressure of the reduced pressure exhaust mechanism.

32. The method of claim 31, further comprising providing one or more substrate transport slots between the substrate process area and the substrate transfer section to maintain the low pressure in the substrate process area relative to the substrate transfer section.

33. The method of claim 31, further comprising arranging the substrate transfer section and the substrate process area to be located substantially horizontal relative to one another to reduce particle transport between the substrate transfer section and the substrate process area.

34. The method of claim 31, further comprising providing a chemical processing section within the substrate process area.

35. The method of claim 34, wherein maintaining the low pressure in the substrate process area relative to the substrate transfer section is to substantially contain chemical vapors within the chemical processing section from reaching the substrate transfer section.

\* \* \* \* \*

UNITED STATES PATENT AND TRADEMARK OFFICE
CERTIFICATE OF CORRECTION

PATENT NO.         : 8,282,698 B2
APPLICATION NO.    : 12/730880
DATED              : October 9, 2012
INVENTOR(S)        : Eric H. Lenz It is certified that error appears in the above-identified patent and that said Letters Patent is hereby corrected as shown below:

In column 12, line 36, delete "feet" and insert --$feet^2$--, therefor

In column 14, line 11, delete "ton" and insert --torr--, therefor

In column 14, line 14, delete "ton" and insert --torr--, therefor

In column 14, line 16, delete "ton" and insert --torr--, therefor

In column 14, line 21, delete "ton" and insert --torr--, therefor

In column 15, line 22, delete "ton" and insert --torr--, therefor

Signed and Sealed this
Ninth Day of April, 2013

Teresa Stanek Rea
*Acting Director of the United States Patent and Trademark Office*